(12) United States Patent
Ge et al.

(10) Patent No.: US 9,353,440 B2
(45) Date of Patent: *May 31, 2016

(54) DUAL-DIRECTION CHEMICAL DELIVERY SYSTEM FOR ALD/CVD CHAMBERS

(71) Applicant: Applied Materials, Inc., Santa Clara, CA (US)

(72) Inventors: Zhenbin Ge, San Jose, CA (US); Chien-Teh Kao, Sunnyvale, CA (US); Joel M. Huston, San Jose, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 130 days.

This patent is subject to a terminal disclaimer.

(21) Appl. No.: 14/137,007

(22) Filed: Dec. 20, 2013

(65) Prior Publication Data

US 2015/0176126 A1 Jun. 25, 2015

(51) Int. Cl.
*C23C 16/455* (2006.01)
*B08B 9/032* (2006.01)
*C23C 16/44* (2006.01)

(52) U.S. Cl.
CPC .......... *C23C 16/45574* (2013.01); *B08B 9/0325* (2013.01); *C23C 16/4412* (2013.01); *C23C 16/45565* (2013.01); *C23C 16/45578* (2013.01); *Y10T 137/4259* (2015.04)

(58) Field of Classification Search
CPC .................. C23C 16/45565; C23C 16/45578; C23C 16/45574; B08B 9/0325
See application file for complete search history.

(56) References Cited

U.S. PATENT DOCUMENTS

| 5,186,718 | A | 2/1993 | Tepman et al. |
| 5,451,290 | A | 9/1995 | Salfelder |
| 5,500,256 | A | 3/1996 | Watabe |
| 6,050,506 | A | 4/2000 | Guo et al. |
| 6,086,677 | A | 7/2000 | Umotoy et al. |
| 6,302,964 | B1 | 10/2001 | Umotoy et al. |
| 6,620,289 | B1 | 9/2003 | Yan et al. |
| 6,647,993 | B2 | 11/2003 | Shang et al. |
| 6,793,733 | B2 | 9/2004 | Janakiraman et al. |
| 6,827,815 | B2 | 12/2004 | Hytros et al. |

(Continued)

FOREIGN PATENT DOCUMENTS

| JP | 2007-005491 | 1/2007 |
| JP | 2011-086776 | 4/2011 |

(Continued)

OTHER PUBLICATIONS

Non-Final Office Action in U.S. Appl. No. 13/653,952, dated Jan. 23, 2015, 8 pages.

(Continued)

*Primary Examiner* — Kevin Lee
(74) *Attorney, Agent, or Firm* — Servilla Whitney LLC

(57) ABSTRACT

Provided are gas distribution apparatus with a delivery channel having an inlet end, an outlet end and a plurality of apertures spaced along the length. The inlet end is connectable to an inlet gas source and the outlet end is connectible with a vacuum source. Also provided are gas distribution apparatus with spiral delivery channels, intertwined spiral delivery channels, splitting delivery channels, merging delivery channels and shaped delivery channels in which an inlet end and outlet end are configured for rapid exchange of gas within the delivery channels.

18 Claims, 22 Drawing Sheets

(56) References Cited

U.S. PATENT DOCUMENTS

| | | | |
|---|---|---|---|
| 6,983,892 B2 | 1/2006 | Noorbakhsh et al. | |
| 7,976,631 B2 | 7/2011 | Burrows et al. | |
| 8,955,547 B2 * | 2/2015 | Gungor et al. | 137/597 |
| 2001/0027026 A1 | 10/2001 | Dhinsa et al. | |
| 2003/0124842 A1 | 7/2003 | Hytros et al. | |
| 2003/0172872 A1 | 9/2003 | Thakur et al. | |
| 2004/0003777 A1 | 1/2004 | Carpenter et al. | |
| 2004/0082251 A1 | 4/2004 | Bach et al. | |
| 2004/0127067 A1 | 7/2004 | Dunham | |
| 2005/0092247 A1 | 5/2005 | Schmidt et al. | |
| 2005/0173569 A1 | 8/2005 | Noorbakhsh et al. | |
| 2006/0021703 A1 | 2/2006 | Umotoy et al. | |
| 2007/0022954 A1 | 2/2007 | Iizuka et al. | |
| 2009/0056626 A1 | 3/2009 | Thakur et al. | |
| 2010/0075066 A1 | 3/2010 | Ueda et al. | |
| 2011/0011338 A1 | 1/2011 | Chuc et al. | |
| 2013/0098477 A1 * | 4/2013 | Yudovsky et al. | 137/507 |

FOREIGN PATENT DOCUMENTS

| | | |
|---|---|---|
| KR | 10-2009-0055443 | 6/2009 |
| KR | 10-2009-0069075 | 6/2009 |
| KR | 10-0920324 | 10/2009 |
| KR | 10-0931331 | 12/2009 |
| KR | 10-2010-0002886 | 1/2010 |
| KR | 10-2010-0003536 | 1/2010 |
| KR | 10-0936694 | 1/2010 |
| KR | 10-0936695 | 1/2010 |
| KR | 10-0946159 | 3/2010 |
| KR | 10-0949913 | 3/2010 |
| KR | 10-0949914 | 3/2010 |
| KR | 10-2010-0064341 | 6/2010 |
| KR | 10-0960958 | 6/2010 |
| KR | 10-1028408 | 4/2011 |
| KR | 10-1072670 | 10/2011 |
| KR | 10-1081694 | 11/2011 |
| KR | 10-1095687 | 12/2011 |
| KR | 10-1134277 | 4/2012 |
| KR | 10-1136302 | 4/2012 |
| WO | WO-2011/009002 | 1/2011 |

OTHER PUBLICATIONS

PCT International Preliminary Report on Patentability in PCT/US2012/061022, dated May 1, 2014, 8 pages.

PCT International Search Report in PCT/US2012/061022, dated Mar. 29, 2013, 4 pages.

PCT International Written Opinion in PCT/US2012/061022, dated Mar. 29, 2013, 7 pages.

* cited by examiner

DUAL-DIRECTION CHEMICAL DELIVERY SYSTEM FOR ALD/CVD CHAMBERS

BACKGROUND

Embodiments of the invention generally relate to an apparatus and a method for flowing a gas into a processing chamber. More specifically, embodiments of the invention are directed to dual directional chemical delivery systems.

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 µm and aspect ratios of 10 or greater. Accordingly, conformal deposition of materials to form these devices is becoming increasingly important.

With the ever-increasing requirements to achieve better deposition uniformity, high productivity and low defects in atomic layer deposition and chemical vapor deposition, many chemical delivery systems have been proposed in the industry. More specifically, multi-channel systems with pump-purge capability have started to emerge in the industry due to their unique properties. The multi-channel design avoids chemical mixing before introduction to the chamber. Integrated direct pump-purge capability allows fast pumping of the channel, thus enabling higher productivity and lower defects.

However, one of the biggest challenges facing the multi-channel direct pump-purge system is the flexibility to tune deposition uniformity. Due to the long channel length, the locations where the chemical and/or purge are introduced will leave certain memory impact on the deposition uniformity. Furthermore, for the same hardware apparatus, different memory effects for different chemicals due to the differences in flow characteristics. For example, in a spiral channel design, the precursor absorption flux on the wafer shows concentration gradient corresponding to the channel length. Accordingly, there is a need in the art for showerhead designs to achieve better uniformity of precursor distribution.

SUMMARY

One or more embodiments of the invention are directed to gas distribution apparatus to control flow of gas into a process chamber. The apparatus comprises a gas distribution plate having a front side and backside. A gas delivery channel extends through the gas distribution plate and has a length which is defined by a first end and a second end. The delivery channel includes a plurality of apertures spaced along a length of the gas delivery channel. The apertures extend through the gas distribution plate to the front side of the gas distribution plate. A gas delivery system is connected to the first end and the second of the gas delivery channel. The gas delivery system comprises a first inlet line in flow communication with the first end of the delivery channel and a second inlet line in flow communication with the second end of the delivery channel. The gas delivery system further comprises a pump line, a first purge line in flow communication with the first inlet line and a second purge line in flow communication with the second inlet line. The apparatus includes a controller to regulate the flow of gas through the delivery channel and into the process chamber.

Additional embodiments of the invention are directed to the gas distribution apparatus to control flow of gas until process chamber comprising a gas distribution plate with a first gas delivery channel and a second gas delivery channel. The gas distribution plate has a front side and backside. The first gas delivery channel extends through the gas distribution plate and has a length defined by first end of the second end.the first delivery channel includes a plurality of apertures spaced along a length which extend through the gas distribution plate to the front side of the gas distribution plate. The second gas delivery channel extends through the gas distribution plate and has a length defined by a third end and a fourth end.the second gas delivery channel includes a plurality of apertures spaced along a length extending through the gas distribution plate to the front side of the gas distribution plate. the gas distribution apparatus includes a gas delivery system comprising a first inlet line, a second inlet line, a third inlet line, a stop listening him fourth inlet line, a pump line, a first purge line, a second purge line, a third purge line and a fourth purge line. The first purge line is in flow communication with the first end of the first gas delivery channel and the second inlet line is in flow communication with the second and of the first gas delivery channel. The third inlet line is in flow communication with third end of the second gas delivery channel and the fourth inlet line is in flow communication with the fourth end of the second gas delivery channel. The first purge gas line is in flow communication with the first inlet line, the second purge gas line is in flow communication with the second inlet line, the third purge gas line is in flow communication with the third inlet line and the fourth purge line is in flow communication with the fourth inlet line. The apparatus includes a controller to regulate the flow of gas through the first gas delivery channel and the second gas delivery channel and into the process chamber.

Further embodiments of the invention are directed to processing chambers comprising at least one gas distribution apparatus. Each gas distribution apparatus comprises a gas distribution plate having a front side and backside. A gas delivery channel extends through the gas distribution plate and has a length which is defined by a first end and a second end. The delivery channel includes a plurality of apertures spaced along a length of the gas delivery channel. The apertures extend through the gas distribution plate to the front side of the gas distribution plate. A gas delivery system is connected to the first end and the second of the gas delivery channel. The gas delivery system comprises a first inlet line in flow communication with the first end of the delivery channel and a second inlet line in flow communication with the second end of the delivery channel. The gas delivery system further comprises a pump line, a first purge line in flow communication with the first inlet line and a second purge line in flow communication with the second inlet line. The apparatus includes a controller to regulate the flow of gas through the delivery channel and into the process chamber.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention are directed to gas distribution apparatus for use in chemical vapor deposition and atomic layer deposition type processes. The gas distribution apparatus described may be referred to as a showerhead or gas distribution plate, but it will be recognized by those skilled in the art that the apparatus does not need to be shaped like a showerhead or plate. The terms "showerhead" and "plate" should not be taken as limiting the scope of the invention.

The inventors have found that a dual direction chemical delivery system can solve the channel concentration distribution induced non-uniformity issues. For example, in a spiral flow channel, when the precursor is introduced from the center of a channel, it has higher concentration at center than at edge. The inventors have found that adding the capability to enable dual direction chemical delivery from either center or edge of the spiral can help to compensate for the non-uniformity in concentration distribution.

In another example, when a precursor is introduced into a quadra-spiral channel (see FIG. 20) from 0/90 degree and pumped from 45 degree, the deposition map shows thinner deposition from center to 0/90 directions, leaving thicker deposition at four 45 degree sessions. Conversely, when precursor is introduced from 45 degree and pumped from 0/90 degree, the deposition map shows thinner deposition from four 45 degree sessions, leaving thicker deposition at center to 0/90 directions.

Because of the complementary profile from those two configurations, a dual direction chemical delivery system can take advantage of the concentration distribution with the same hardware configuration. In both channel 1 and channel 2, the described embodiments enable dual direction chemical delivery in the same hardware set up. This not only conserves the benefits of multi-channel set-up, but also incorporates the flexibility of modulation of chemical concentration distribution without complex re-design of other hardware components.

For example, the precursor delivery line can alternate from both directions to take advantage of the complimentary concentration profile. Embodiments can also alternate the purge flow in both directions. The deposition profile not only depends on the precursor flow, but also on the purge flow. In ALD process, the purpose of the purge flow is to remove the residue chemicals in channel, chamber, and wafer surface. Similar to the non-uniform precursor delivery onto the wafer surface, purge flow can also have non-uniform purging effect on wafer surface, contributing to the non-uniformity in final deposition profile.

In some embodiments, both precursor flow and purge flow can be alternate directions concurrently. The set-up can independently control flow directions in an individual channel. The same set-up can also accommodate alternating pumping directions with two additional valves connecting one of the inlets to the pumping lines.

Figure 1:
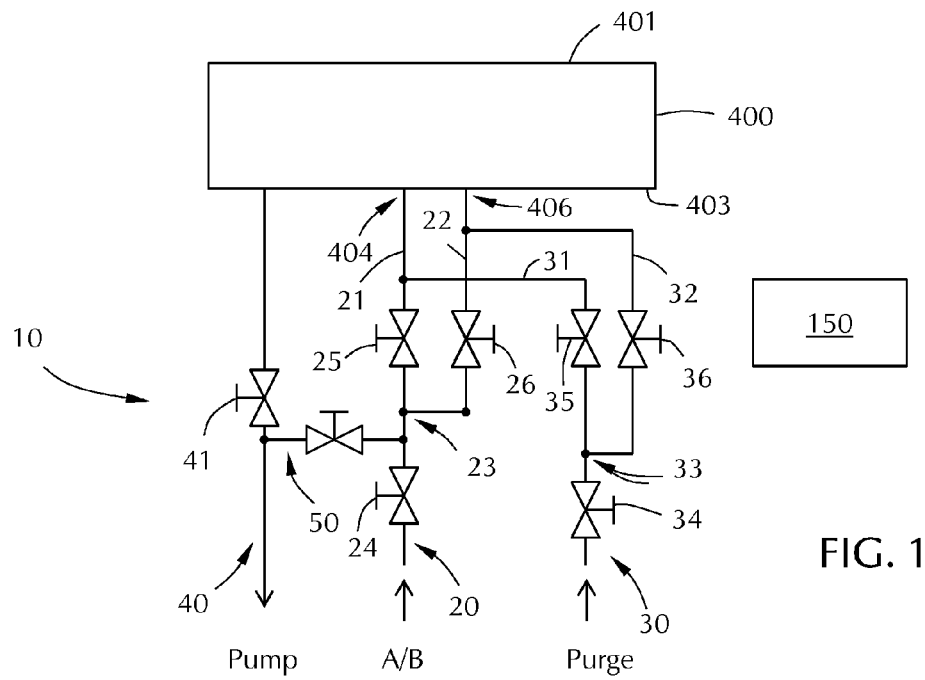
FIG. 1 shows a gas delivery system in accordance with one or more embodiments of the invention.

Referring to FIG. 1, a first embodiment of the invention is directed to a gas distribution apparatus to control a flow of gas, or flows of gases, into and out of a processing chamber. The gas distribution apparatus includes a gas distribution plate 400 which has a front side 401 and a back side 403 and a gas. The front side 401 shown in the Figures faces a surface which processing is performed on, for example, a substrate or a film on a substrate surface.

The gas distribution plate 20 includes at least one gas delivery channel (shown in FIGS. 3-21) which has a first end 404 and a second end 406. The terms "first end", "second end", "third end", "fourth end" and the like are used merely to designate an end of a gas delivery channel and are not intended to imply an order of operation or importance. For example, a channel that has two ends, has a first end and a second end even though both are equivalent in nature.

A gas delivery system 10 is in flow communication, also called fluid communication, with the gas delivery channel. The gas delivery system 10 has an inlet line 20 in fluid communication with the first end 404 and second end 406 of the gas delivery channel. The inlet line 20 shown in FIG. 1 splits into two legs making a first inlet line 21 which is in flow communication with the first end 404 and a second inlet line 22 which is in flow communication with the second end 406 of the gas delivery channel. Again, the naming/numbering of the inlet lines is arbitrary and should not imply order or preference.

A processing gas, also referred to as a reactive gas, flows through the inlet line 20 into the processing chamber through the gas distribution plate 400. The inlet line 20 shown includes an inlet wye 23 which separates the gas flow in the inlet line 20, thereby splitting the flow into the first inlet line 21 and the second inlet line 22. The flow split through the wye 23 can be adjusted so 0-100% of the gas flowing through the inlet line 20 is directed down the first inlet line 21 with the remainder (if any) directed through the second inlet line 22.

The inlet line 20 can include an inlet valve 24 in flow communication with the inlet line 20. The inlet valve 24 shown in FIG. 1 is located upstream of the inlet wye 23 and can be used to prevent any gas from flowing through the inlet line toward the wye 23. As used in this specification and the appended claims, the terms "upstream" and "downstream" mean, respectively, before and after relative to the described component. For example, the inlet valve 24 is upstream of the wye 23 means that a flow of gas would encounter the inlet valve 24 before the wye 23.

The embodiment shown in FIG. 1 also includes a first inlet valve 25 in flow communication with the first inlet line 21 and a second inlet valve 26 in flow communication with the second inlet line 22. Any or all of these valves, 24, 25, 26 an be fully open, fully closed or anywhere in between. The valves 24, 25, 26 can be operated manually or automatically, and independently or together.

The gas delivery system 10 includes a purge line 30 which is used to flow a purge gas (e.g., an inert gas) into the processing chamber through the gas distribution plate 400 and through any of the lines in fluid communication with the purge line 30. The purge line 30 shown in FIG. 1 splits at a purge wye 33 into a first purge line 31 and a second purge line 32. The flow split through the purge wye 33 can be adjusted so 0-100% of the gas flowing through the purge line 30 is directed down the first purge line 31 with the remainder (if any) directed through the second purge line 32.

The purge line 30 can include a purge valve 34 in flow communication with the purge line 30. The purge valve 34 shown in FIG. 1 is located upstream of the purge wye 33 and can be used to prevent any gas from flowing through the purge line toward the wye 33. The embodiment shown in FIG. 1 also includes a first purge valve 35 in flow communication with the first purge line 31 and a second purge valve 36 in flow communication with the second purge line 32. Any or all of these valves, 34, 35, 36 an be fully open, fully closed or anywhere in between. The valves 34, 35, 36 can be operated manually or automatically, and independently or together.

In some embodiments, the first purge line 31 connects with and is in flow communication with the first inlet line 21 upstream of the gas distribution plate 400 and the second purge line 32 connects with and is in flow communication with the second inlet line 22 upstream of the gas distribution plate 400. The flow of purge gas to the processing chamber can be intermittent, pulsed or constant depending on the processing conditions. In some embodiments, a constant flow of a purge gas is maintained so that the purge gas and reactive gases are flowing simultaneously through the last portion of the inlet lines to the gas distribution plate.

A pump line 40 is in flow communication with the gas distribution plate 400 and connects to a vacuum system. The vacuum system can be any suitable vacuum system including an individual vacuum pump or a house foreline. In some embodiments, the pump line 40 is in flow communication with one or more of the first inlet line 21 and the second inlet line 22. This configuration is shown on the left side of FIG. 2 but it will be understood by those skilled in the bridging of the inlet lines and the pump line can be included on any, all or none of the inlet lines. A pump valve 41 can positioned along the pump line 40 to isolate the processing chamber from the pump line.

A bypass line 50 can extend between the pump line 40 and the inlet line 20 to draw reactive gases out of the system during purging of the lines. The bypass line 50 can include a bypass valve 51 to isolate the inlet 20 from the pump line 40.

Figure 2:
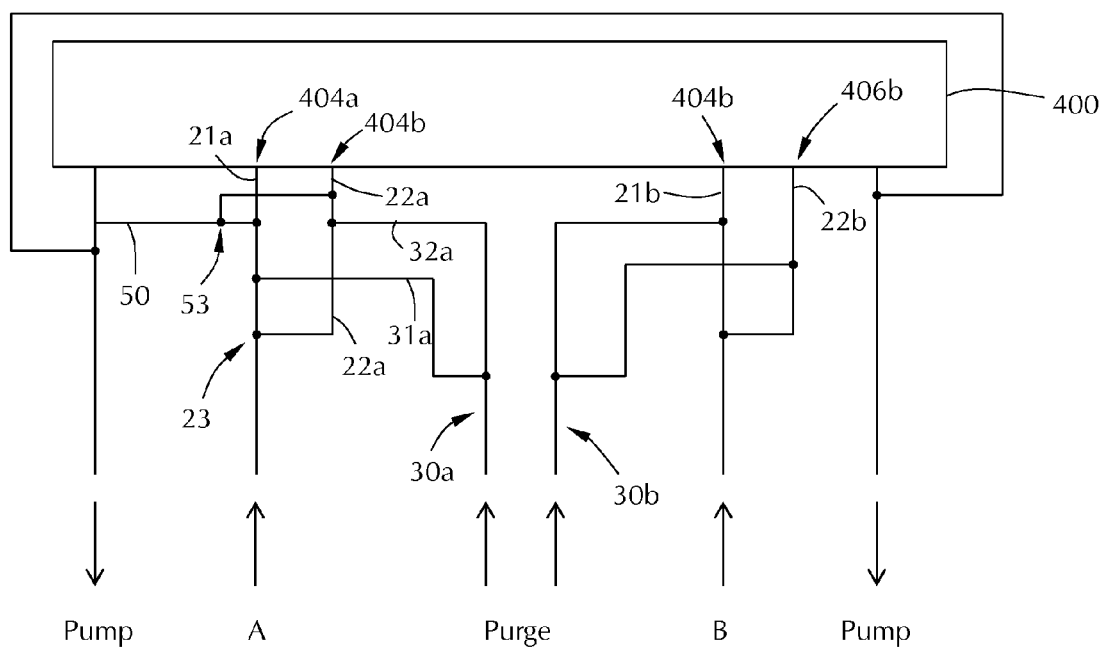
FIG. 2 shows a gas delivery system in accordance with one or more embodiments of the invention.

FIG. 2 shows another embodiment of the invention in which there are two separate gas delivery channels extending through the gas distribution plate 400. For clarity sake, valves have been left out of this drawing, but it will be understood by those skilled in the art, that any number of valves can be placed along the various gas lines. For example, the valves shown in FIG. 1 can have corresponding locations within the various gas lines of FIG. 2. Various dual channel embodiments are described further below. The gas distribution plate 400 can have any number of individual gas delivery channels with any number of reactive gases. The embodiment shown in FIG. 2 has two gas delivery channels, with each channel delivering a different reactive gas A or B.

The first gas delivery channel has a first end 404a and a second end 406a connected to, respectively, a first inlet line 21a and a second inlet line 22a as in the embodiment of FIG. 1. The second gas delivery channel has a third end 404b and a fourth end 406b. The third end 404b is in fluid communication with a third inlet line 21b and the fourth end 406b is in fluid communication with a fourth inlet line 22b.

A purge line 30a, 30b is in fluid communication with the processing chamber through the first inlet line 21a, second inlet line 22a, third inlet line 21b and fourth inlet line 22b, as described above with respect to FIG. 1. The embodiment shown has two purge lines 30a, 30b but it will be understood that a single purge line can be used and split using a suitable splitting device (e.g., a gradient proportioning valve) into the various purge gas lines as needed.

In use, A reactant gas can be flowed through inlet line 20 towards the processing chamber. The gas flow in inlet line 20 can be split into a first inlet line 21 and the second inlet line 22 at wye 23. The wye 23 can be any suitable component which is capable of splitting the gas flow. For example, a gradient proportioning valve which is capable of splitting the flow within a range of 100:0 into first inlet line 21:second inlet line 22 to 0:100 into first inlet line 21:second inlet line 22. In one or more embodiment the Wye 23 splits the gas flow about evenly between the first inlet e 21 and the second inlet line 22. With an even split between the inlet lines, assuming all else is equal, the pressure of the reactive gas at the first end and second and of the gas delivery channel will be even.

A purge gas, which can be any suitable gas such as an inert gas or a diluent gas, can be flowed through purge line 30. The purge gas flow can be split at wye 33 into a first purge line 31 and the second purge line 32. The first purge line 31 and second purge line 32 can flow directly into the processing chamber or, as shown in the figures, can merge with the first inlet line 21 and second Inlet line 22. The flow of purge gas entering the inlet lines can remain constant or can be variable.

When both purge gas and reactive gases are flowing through the inlet lines entering the gas distribution plate, the purge gas serves to both form a uniform pressure in the gas channel as well as dilute the concentration of the reactive gas.

The pump line 40 can be used to evacuate the processing chamber and to help purge all gases from the inlet line 20 and purge gas line 30. Purging the gases from the gas delivery system using the pump line 40 can be accomplished fruit use of bypass line 50. Bypass line valve 51 can be opened so that there is fluid communication between the pump line 40 and the inlet line 20. If the first inlet valve 25 and the second inlet valve 26 are in the closed position, reactive gases flowing through inlet line 20 and inlet valve 24 will flow directly through the bypass valve 51 and bypass line 52 be pumped out of the system. Closing inlet valve 24 would ensure that no additional reactive gases lost directly to the pump line and allow for the complete evacuation of the system downstream of the inlet valve 24. Opening the first inlet valve 25 and second inlet valve 26 while keeping inlet valve 24 closed will cause purge gas flowing from the first purge line 31 and the second purge line 32 to backflow through inlet valve 25 and inlet valve 26, past the white 23, and through bypass valve 51 of bypass line 52 the pump. This operation can ensure that the entire gas system has been purged of reactive gases downstream of inlet valve 24.

During processing, the reactive gas flowing through inlet line 20 can be changed as often as is necessary. Changing the reactive gas can be used for atomic layer deposition type processing in which the substrate is alternately exposed to a precursor and a reactant to form a film on the substrate surface. A manifold (not shown) can be connected to the inlet line 20 so that the reactive gas flowing into inlet line 20 can be changed. The pump line 40 and combination of valves can be used to ensure that the gas delivery system has been purged of a first reactive gas before allowing the second reactive gas to flow through system. This helps to ensure that there are no gas phase Reactions within the system.

In the embodiment shown in FIG. 2, both the first reactive gas, labeled as A, and the second reactive gas, labeled as B, can be flowed into the processing chamber at the same time. This is particularly useful where the gas distribution plate is able to maintain separation of the gases until after they have been flowed into the processing chamber. For example, see the embodiments described with respect to FIGS. 10-17. The embodiments shown has two purge inlet lines 30a, 30b. While these lines are shown as separate, it will be understood by those skilled in the art, that both lines can come from the same gas source and be split by any suitable splitting mechanism such as a gradient proportioning valve.

The left side of FIG. 2, where the first reactive gas A is shown, has a purge line 50 positioned downstream of wye 23 and connects to both the first input line 21a and the second input line 22a. To split the bypass line 50 so that it can connect with both the first input line, wye 53 can be any suitable type of splitting mechanism such, but not limited to, a gradient proportioning valve. The embodiment shown has the bypass line 50 connecting to the first input line and second input line downstream of the first purge gas line 31a and the second purge gas line 32a. However, it will be understood by those skilled in the art, that this connection can occur upstream of the first purge gas line 31a and second purge gas line 32a, or a combination of upstream and downstream. In embodiments such as this, it may be particularly useful to have valves along the first purge gas line and the second purge gas line, as well as on any of the first input line, second input line and bypass line.

Figure 3:
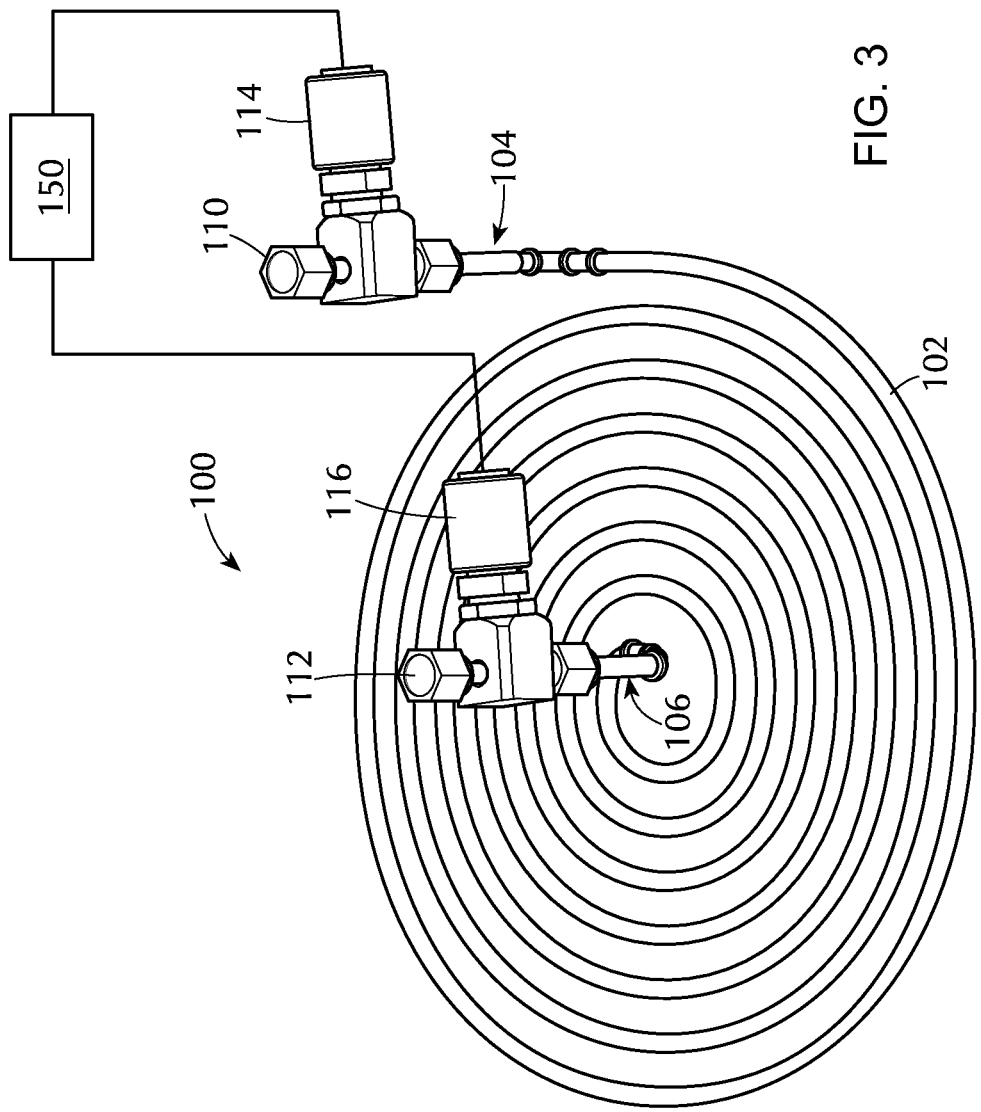
FIG. 3 shows a view of a gas distribution apparatus in accordance with one or more embodiments of the invention.
Figure 4:
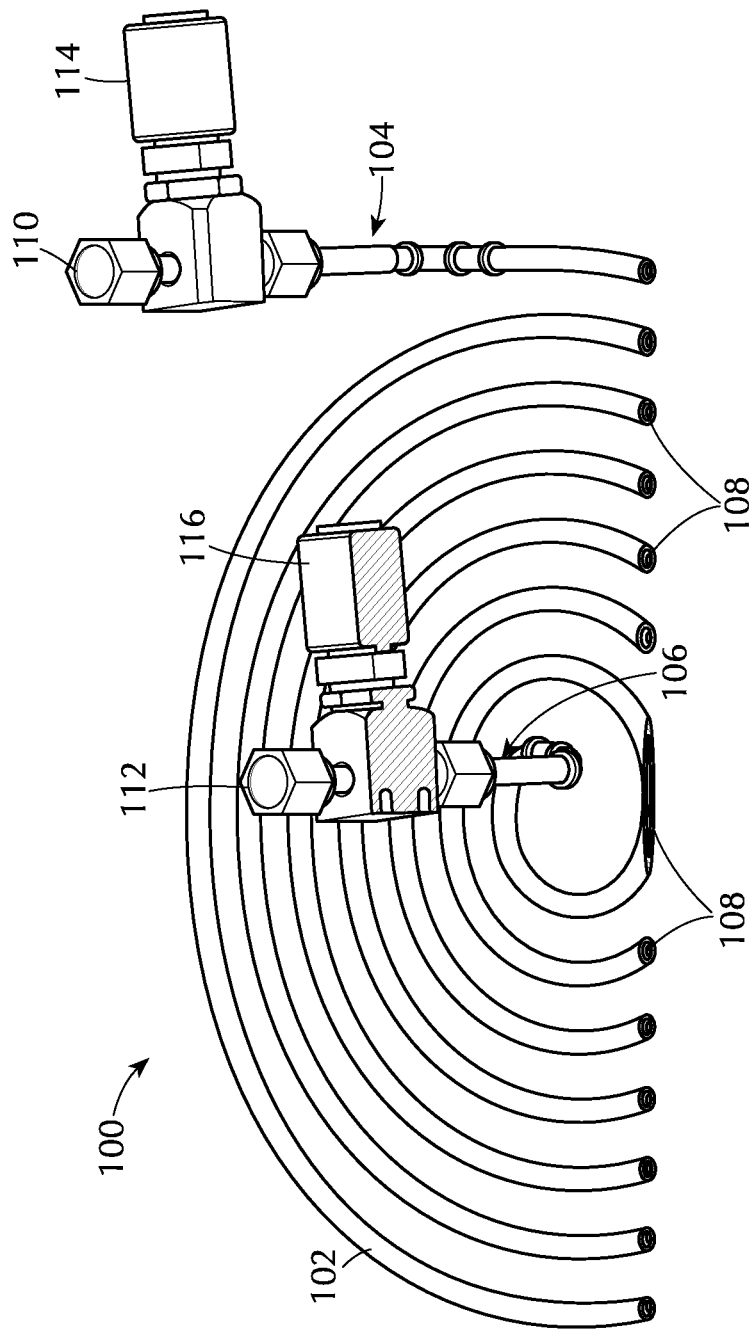
FIG. 4 shows a view of a gas distribution apparatus in accordance with one or more embodiments of the invention.

Referring to FIGS. 3 and 4, one or more embodiments are directed to gas distribution apparatus 100 to deliver a gas to a process chamber (not shown). The gas distribution apparatus 100 comprises a delivery channel 102 with a first end 104 and a second end 106. The delivery channel 102 has a plurality of apertures 108 spaced along the length of the delivery channel 102. An connector 110 is connected to and in fluid communication with the inlet end 104 of the delivery channel 102. A connector 112 is connected to and in fluid communication with the second end 106 of the delivery channel 102. The connector 110 is adapted to be connected to a gas delivery system or gas source and may include a valve 114 capable of controlling the flow of gas into (or out of) the delivery channel 102 or completely cut off the flow of gas. The connector 112 is adapted to be connected to a gas delivery system and may include a valve 116 capable of controlling the flow of gas into (or out of) the delivery channel 102 or completely cut off the flow of gas.

A controller 150 regulates the flow of the gas through the delivery channel 102 and into the process chamber. The controller 150 does this by opening or closing (or any point in between fully open and fully closed) the various valves during gas delivery and gas purging. This controls the flow of gas through apertures (seen, for example, in FIG. 5) spaced along the length of the channel.

The cross-sectional shape of the delivery channel 102 can be controlled such that gas flowing through the delivery channel experiences minimal resistance to flow. In some embodiments, the delivery channel 102 has a round or oval cross-sectional shape. In one or more embodiments, the delivery channel 102 has a cross-sectional shape sufficient such that bends, turns, twists, etc. provide substantially no dead space.

The overall shape (as opposed to the cross-sectional shape) of the delivery channel 102 can be modified as desired. For example, the delivery channel 102 can be shaped to fit within specific areas or to match the shape of a substrate. The delivery channel 102 can be, for example, straight, round, square, oval, rectangular or oblong. Additionally, the overall shape of the delivery channel can be made up of repeating units, parallel, perpendicular or concentric to each other. In one or more embodiments, the delivery channel has an overall shape in which there is substantially no dead space to inhibit gas flow or purging. As used in this specification and the appended claims, the term "substantially no dead space" means that the flow of gas, or purging, is inhibited by less than about 10% or by less than about 5% due to dead space.

In some embodiments, the delivery channel 102 is a tubular spiral having a substantially planar configuration. This particular shape is exemplified by the embodiment shown in FIGS. 3 and 4. As used in this specification and the appended claims, the term "substantially planar configuration" means that the plurality of apertures 108 in the delivery channel 102 are in mostly the same plane. The embodiment shown in FIGS. 3 and 4 has a substantially planar configuration because the apertures are coplanar, even though the inlet end and outlet end, and the portions of the delivery channel near the inlet end and outlet end are not coplanar with the plurality of apertures.

The delivery channel 102 can be used for plasma processing. For example, the delivery channel 102 can be polarized relative to another portion of the processing chamber to ignite a plasma within the chamber. The delivery channel 102 can be biased relative to a portion of the chamber, or a portion of the chamber can be biased relative to the delivery channel 102. For example, the delivery channel 102 can be polarized relative to a substrate support pedestal in a processing chamber, or the pedestal can be polarized relative to the delivery channel.

The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

Any suitable material can be used for the delivery channel, showerhead or gas distribution apparatus. Suitable materials include, but are not limited to stainless steel and inert materials. In some embodiments, the delivery channel, showerhead or gas distribution plate is made of stainless steel.

FIGS. 5 through 8 show another embodiment of a gas distribution apparatus 400 in which the delivery channel 402 is a recessed channel in the back side 401 of a gas distribution plate 403. The embodiment shown has a large inner section is recessed in the back side 401 of the gas distribution plate 403 with the delivery channel 402 recessed even further. This allows for the addition of a back cover 407 which can be placed in the recessed area in the back side 401 enclosing the delivery channel 402. The back cover 407, when inserted into the recessed back side 401 of certain embodiments creates a substantially flush back side surface of the gas distribution plate. It will be understood by those skilled in the art that the back cover 407 does not need to fit within a recessed area of the back side 401 of the gas distribution plate 403, but can also rest directly on the back side 401 of the gas distribution plate 403. In embodiments of this sort, there is no large recessed area with the delivery channels being further recessed. Instead, the delivery channels are recessed directly into the back side 401 of the gas distribution plate 403.

The back cover 407 may have openings to allow for the passage of inlet and outlet tubes to allow for fluid communication with the delivery channel 402. For example, connectors 404, 406 can act as inlets or outlets or both depending on the processing conditions. This can be seen in FIGS. 6 and 7. The inlet and outlet tubes can be an integral part of the back cover 407, or can be separate pieces connected to the back cover 407 in such a manner as to prevent or minimize fluid leakage. A plurality of apertures 408 extend through the gas distribution plate 403 to a front side 405 of the gas distribution plate 403. These apertures can be seen in FIGS. 6, 7 and 8. The plurality of apertures 408 can be evenly spaced along the length of the delivery channel, or can have varied spacing along the length of the channel. Variable spacing may help produce a more uniform gas flow from the delivery channel at points along the delivery channel. For example, in gas delivery channel that has an elaborate shape, the spacing of the apertures can varied along the length.

In the embodiment shown in FIGS. 5-8, the gas distribution plate 403 is round and the delivery channel 402 forms a spiral shape. The connector 404 is denoted at the outside of the spiral in an outer peripheral region 420 of the gas distribution plate 403 with the connector 406 at the center of the spiral in a central region 422 of the gas distribution plate 403. It will be understood by those skilled in the art that the connector 404 and connector 406 can be inlets or outlets or both.

Figure 6:
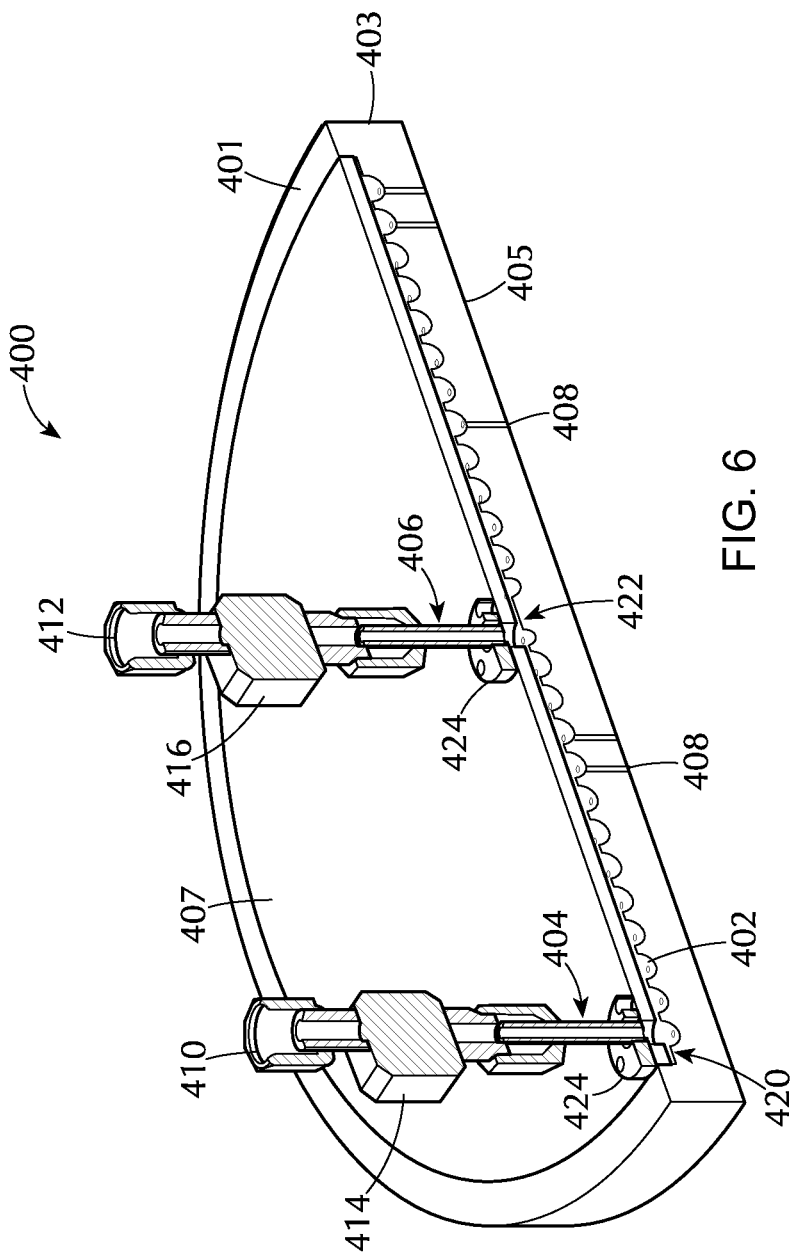
FIG. 6 shows a cross-section of a perspective view of a gas distribution apparatus in accordance with one or more embodiments of the invention
Figure 7:
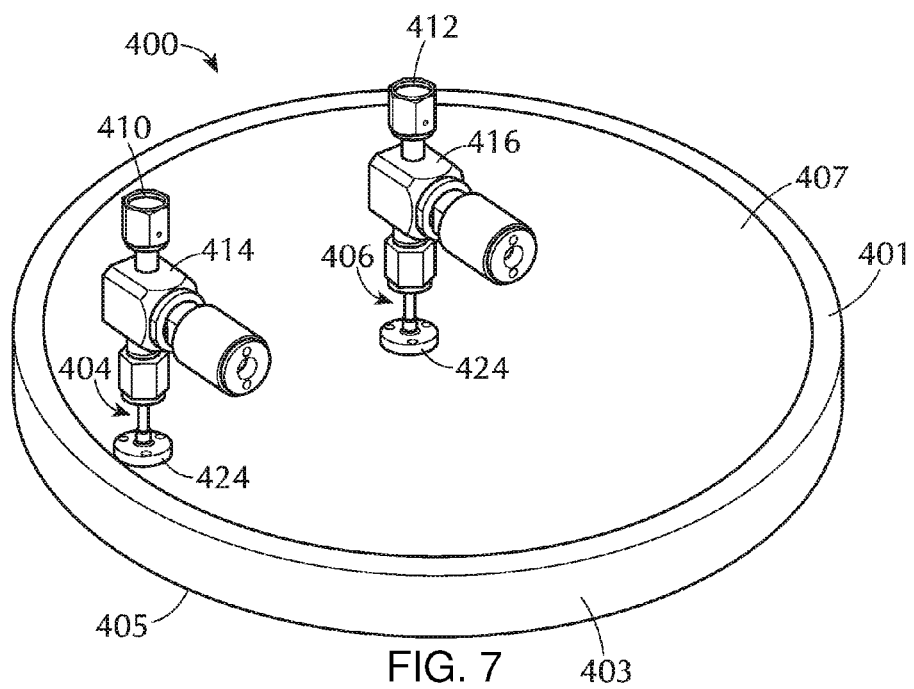
FIG. 7 shows a perspective view of a gas distribution apparatus in accordance with one or more embodiments of the invention.
Figure 8:
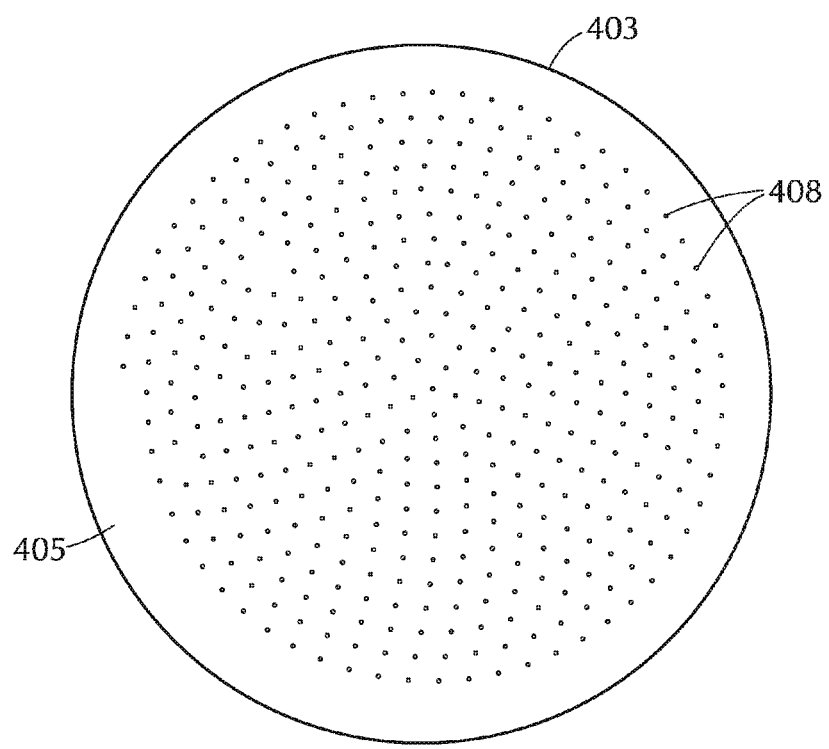
FIG. 8 shows a bottom view of a gas distribution apparatus in accordance with one or more embodiments of the invention.

In FIGS. 6 and 7, connector 404 and connector 406 are illustrated as a small tube extending from the back cover 407 of the gas distribution plate 403. The tubes extend between the inlet 410 and the back cover 407 through an valve 414. Another tube can extend between the outlet 412 and the back cover 407 through the valve 416. The tubes can be connected to the back cover 407 by any suitable connection known to those skilled in the art and may be sealed to prevent leakage of fluid flowing through the tube into the delivery channel 402. Suitable sealing devices include, but are not limited to, o-rings positioned between a flange 424 and the back cover 407. The flange 424 can be integrally formed with the tube or can be a separate piece that holds the tube to the back cover. The flange 424 can be connected to the back cover 407 by any suitable mechanical connection, including but not limited to, screws.

Figure 9A:
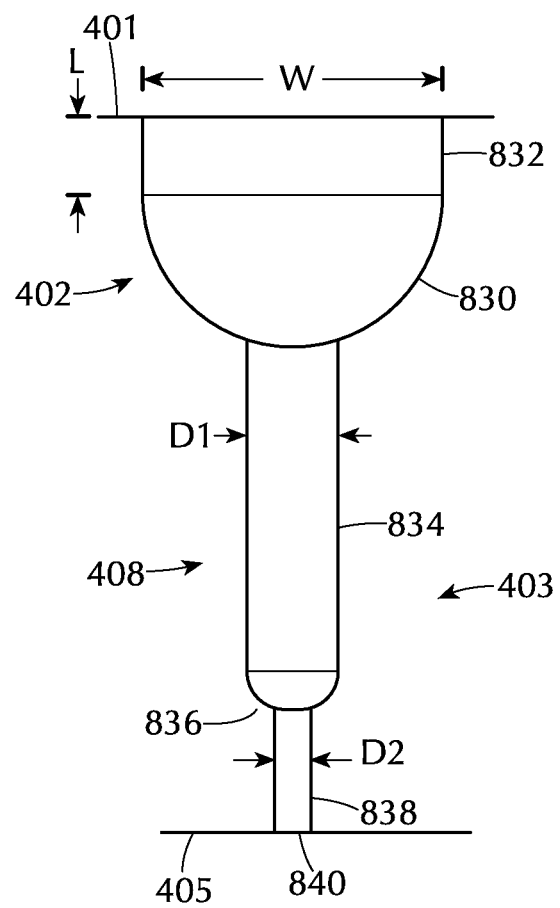
FIG. 9A shows a partial cross-sectional view of a gas distribution apparatus in accordance with one or more embodiments of the invention.

FIG. 9A shows a cross-sectional view of one portion of a delivery channel 402 and an aperture 408 in a gas distribution plate 403 in accordance with one or more embodiments of the invention. It will be understood by those skilled in the art that the delivery channel and apertures described in FIG. 9A are merely illustrative and should not be taken as limiting the scope of the invention. Those skilled in the art will understand that there are other ways of creating flow from the delivery channel 402 through the gas distribution plate 403. The delivery channel 402 shown in FIG. 9A has two portions, an upper portion 832 and a lower portion 830. While these portions are shown as separate areas, it will be understood that there can be a seamless transition between the upper portion 832 and the rounded lower portion 830.

Additionally, it will be understood that the upper portion 832 is optional and does not need to be included in the delivery channel 402. When there is no upper portion 832, the lower portion 830 is the only portion. Thus, the delivery channel can have any suitable shape. In some embodiments, the shape of the delivery channel is such that there is substantially no interference with the flow of gases through the channel.

The upper portion 832 can have any suitable shape. In the embodiment shown in FIG. 9A, the upper portion 832 has walls which extend normal to the surface of the back side 401 of the gas distribution plate 403. However, it will be understood that the upper portion 832 can have walls which are canted from square to the back side 401. The canting can provide a larger opening at the back side 401 of the gas distribution plate 403, tapering to a smaller opening. Additionally, the canting can provide a smaller opening at the back side 401, tapering to a larger opening. The length of the upper portion 832 can be modified as necessary.

In some embodiments, the upper portion has sides which are substantially perpendicular to the back side 401 of the gas distribution plate 403 and extend a length L below the surface of the back side 401 in the range of about 0.01 inch to about 0.3 inches. As used in this specification and the appended claims, the term "substantially perpendicular to" means that walls of the upper portion have an angle relative to the back side of the gas distribution plate in the range of about 85 degrees to about 95 degrees. In some embodiments, the upper portion extends below the surface of the back side to a length L in the range of about 0.02 inches to about 0.2 inches, or in the range of about 0.05 inches to about 0.15 inches, or in the range of about 0.08 inches to about 0.12 inches. In one or more embodiments, the upper portion extends below the surface of the back side to a length about 0.1 inches.

The rounded lower portion 830 can have any suitable cross-section including, but not limited to, half-round and half-elliptical. The width of the rounded lower portion, also referred to as the diameter of the rounded lower portion, can be modified as necessary. The width of the upper portion can be modified as necessary. The diameter of the delivery channel, in general, can have an impact of the number of loops in the spiral. In some embodiments, as shown in FIG. 9A, the width of the upper portion is about equal to the diameter of the lower portion. The delivery channel of various embodiments has a diameter in the range of about 0.3 inches to about 0.45 inches, or in the range of about 0.325 inches to about 0.425 inches, or in the range of about 0.35 inches to about 0.40 inches. In one or more embodiments, the delivery channel has a diameter of about 0.375 inches.

The specific shape of the apertures 408 can vary depending on the desired flow of gases through the apertures. In the embodiment of FIG. 9A, the aperture 408 has three distinct sections; a first section 834, a second section 836 and a third section 838. Again, the number of sections and the shape of the sections are merely illustrative of one embodiment and should not be taken as limiting the scope of the invention. The first section 834 extends from the rounded lower portion 830 of the delivery channel 402 toward the front side 405 of the gas distribution plate 403. The first section 834 has a first diameter D1. The second section 836 extends from the first section 834 toward the front side 405 and has a diameter which tapers from the first diameter D1 to a second diameter D2, which is generally smaller than the first diameter. The third section 838 extends from the end of the second section 836 and ends at the front side 405 of the gas distribution plate 403. At the intersection of the third section 838 and the front side 405, a hole 840 is formed. Gases flowing through the delivery channel 402 exit the gas distribution plate 403 through this hole 840 into the processing chamber. The hole 840 has about the same diameter as the second diameter D2. In various embodiments, the diameter of the hole 840 is in the range of about 0.01 inches to about 0.25 inches, or in the range of about 0.02 inches to about 0.2 inches, or in the range of about 0.03 inches to about 0.15 inches or in the range of about 0.04 inches to about 0.1 inches. In some embodiments, the hold 840 has a diameter less than about 0.1 inches, or less than about 0.08 inches, or less than about 0.06 inches, or less than about 0.04 inches, or less than about 0.02 inches, or less than about 0.01 inch.

As the delivery channel spirals from the outer peripheral edge of the gas distribution plate to the central region, or vice versa, a seeming plurality of adjacent channels are observable in cross-section, even though it may be a single channel. FIG. 6 shows this seeming plurality of channels. The channels, or separation between loops of the spiral, are separated by a distance. In some embodiments, the distance between the channels, or the loops of the single channel, measured from centers, are in the range of about 0.375 inches to about 0.475 inches, or in the range of about 0.40 inches to about 0.45 inches, or in the range of about 0.41 inches to about 0.43 inches. In one or more embodiments, the average distance between centers of the adjacent channels is about 0.42 inches.

The length of the gas channel shown in FIGS. 5 to 8 can vary depending on a number of factors, including, but not limited to, the diameter of the channel and the distance between the adjacent channels. In various embodiments, the delivery channel has a length in the range of about 140 inches to about 340 inches, or in the range of about 180 inches to about 300 inches, or in the range of about 200 inches to about 280 inches, or in the range of about 220 inches to about 260 inches. In one or more embodiments, the delivery channel has a length of about 240 inches.

The number of apertures are also dependent on a number of factors, including but not limited to, the length of the delivery channel and the spacing of the apertures. In some embodiments having a single spiral channel, there are in the range of about 300 and 900 apertures, or in the range of about 400 to about 800 apertures, or in the range of about 500 to about 700 apertures. In various embodiments, there are greater than about 300, 400, 500, 600, 700 or 800 apertures along the length of the channel. In one or more embodiments, there are about 600 apertures along the length of the delivery channel.

In some embodiments, each of the plurality of apertures 403 has an independent hole diameter and delivery angle relative to the front side 405 of the gas distribution plate. The plurality of apertures 403 may have one or more of (1) variable spacing along the length of the delivery channel; (2) variable hole diameters along the length of the delivery channel; and (3) variable delivery angles along the length of the channel.

In some embodiments, the spacing between apertures vary depending on the expected gas pressure in any particular region of the channel. For example, the gas pressure across the length of the channel will change due to, for example, the presence of apertures allowing gas to escape the channel. To counteract this pressure variability, there can be an increase or decrease in the density of apertures. The regions of the channel can be any length from the entire channel length to lengths less than the diameter of the apertures. For example, the first half of the channel length can have apertures spaced a first amount and the next quarter have apertures spaced closer together (i.e., a greater density of apertures) with the last quarter being even greater density. In some embodiments, the spacing of the plurality of apertures decreases along the length of the delivery channel from the inlet end to the outlet end. The decreasing spaces can be between each channel or between blocks of channels.

Figure 9E:
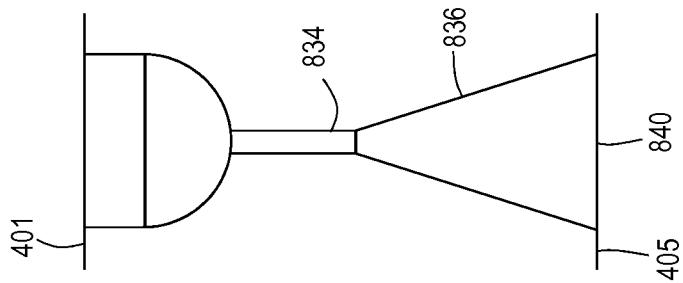
FIGS. 9B through 9G show partial cross-sectional views of a gas delivery channel and apertures in accordance with one or more embodiments of the invention.

The apertures can have any number of possible cross-sections. FIGS. 9A through 9G show a number of possible cross-sections. The apertures can be a single straight line that leads from the channel to the front side, or can have a number of sections. The number of sections and shapes can have an impact on the spray pattern of gases exiting the gas delivery channel through the apertures. In some embodiments, the apertures comprise a first section 834 having a first diameter and a second section 836 having a second diameter which is different from the first diameter. FIG. 9B shows an aperture 808 with a first section 834 adjacent the gas delivery channel and extending toward the front side 405. The second section 836 has a changing diameter which increases from the end closest the first section 834 toward the front side 405. Stated differently, the second diameter transitions from the first diameter to the second diameter. A third section 838 connects the second section 836 to the front side 405. The diameter of the third section 838 is the second diameter.

As shown in comparing FIGS. 9A and 9B, the first diameter can be larger than or smaller than the second diameter. In FIG. 9A, the first diameter is larger than the second diameter and in FIG. 9B, the reverse is the case.

Figure 9D:
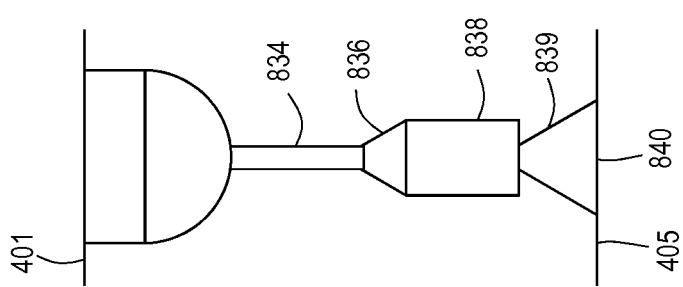
Figure 9C:
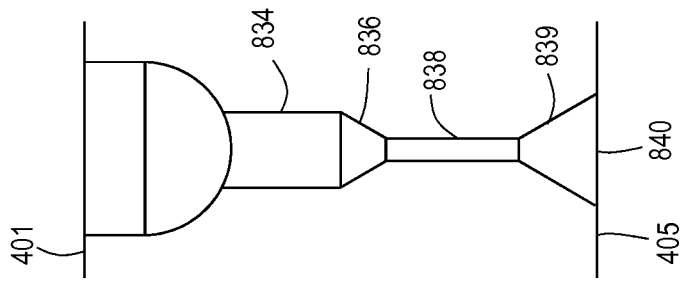
Figure 9B:
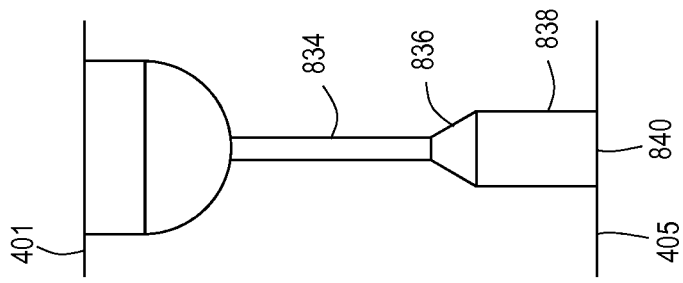

FIGS. 9C and 9D show embodiments of the apertures which include a fourth section 839. In FIG. 9C, the first section 834 has a first diameter, the second section 836 transitions from the first diameter to a second diameter, the third section extends from the second section 836 toward the front side 405. A fourth section 839 extends from the third section 838 to the front side 405 with a varying size diameter. The fourth section 839 diameter increases from the second diameter to a third diameter at the front side 405 so that the hole 840 is larger than the second diameter. The third diameter can be the same as or different from the first diameter and is different from the second diameter. FIG. 9D shows a similar situation in which the first diameter and second diameter are reversed. The size of the hole 840 and the angle of the fourth section 839 can vary and may impact the gas spray pattern. FIG. 9E shows another embodiment in which there are two sections. The first section 834 extends from the gas delivery channel and has a first diameter. The second section 836 extends from the first section 834 to the front side 405 and has a diameter starting at the first diameter and transitioning gradually to the second diameter. While the second diameter shown is larger than the first diameter, it could also be smaller than the first diameter. The embodiments shown are merely exemplary and should not be taken as limiting the scope of the invention.

Figure 9G:
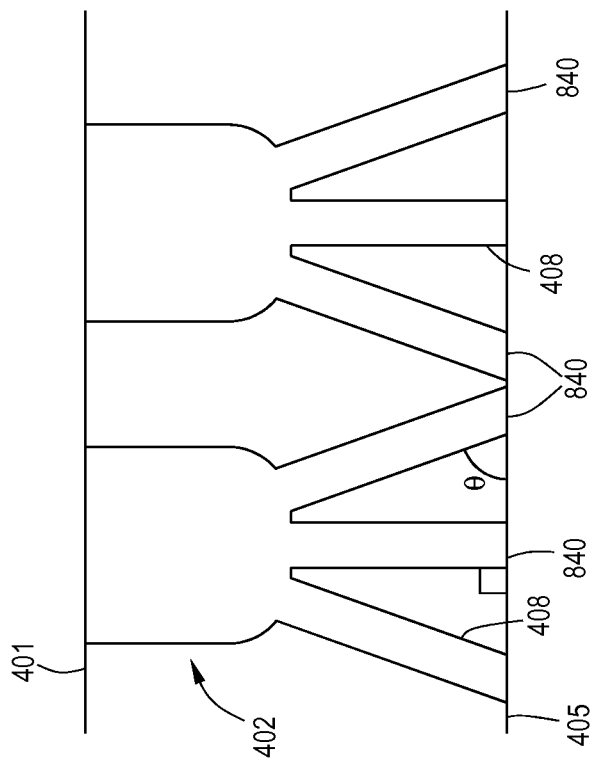
Figure 9F:
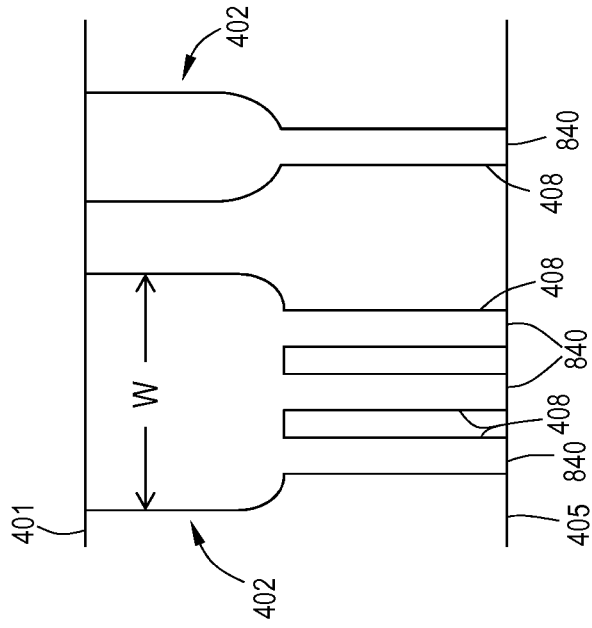

The width W of the gas delivery channels 402 and the pattern/number of apertures 408 across the width W of the gas delivery channels can also vary. FIG. 9F shows a cross-section of a portion of a gas distribution plate with two adjacent channels. The left channel has a width W much larger than the right channel. Additionally, the left channel has three separate apertures 408 extending in a line across the width of the channel. Stated differently, there are three apertures in the channel at the same distance from the inlet end. This means that the plurality of apertures extend along the length of the channel and may also extend along the wide of the channel. The two channels shown in FIG. 9F can be separate portions of the same channel (e.g., adjacent channels of a spiral shape). The diameter of the channel can increase or decrease along the length of the channel to change the gas flow pattern through the channel. The two channels shown in FIG. 9F can also be from separate channels with different gases flowing therethrough. For example, the gas flowing through the wider left channel may not be as reactive as the gas flowing through the narrower right channel, and the amount of the left gas exiting the channel is greater than the amount of the right gas. Again, these are merely examples of possible arrangements and should not be taken as limiting the scope of the invention. The gas distribution apparatus of claim 1, wherein some of the plurality of apertures comprise a plurality of passages forming a line extending across a width of the delivery channel.

In some embodiments, the individual apertures extend toward the front side 405 at varying angles from the gas delivery channel. The apertures can also have variable delivery angles relative to the front side of the gas distribution plate. FIG. 9G shows an embodiment of the invention in which there are two adjacent channels with three apertures extending across the width of each. The channels can be delivering the same gas or adjacent channels delivering different gases. Of the three channels, one extends straight down from the channel to make an angle about 90°, the side channels extend at an angle and make an angle Θ relative to the front side of the gas distribution plate. The angle can be any suitable angle in the range of about 10° to about 90°. In one or more embodiments, the angle is in the range of about 20° to about 85°, or in the range of about 30° to about 80°, or in the range of about 40° to about 75°. In some embodiments, as can be extrapolated from the channels of FIG. 9G, at least some of the plurality of apertures have delivery angles that direct a flow of gas toward a region under an adjacent delivery channel. This can help with uniformity of the deposition by minimizing striping caused by shape of the channel.

Figure 5:
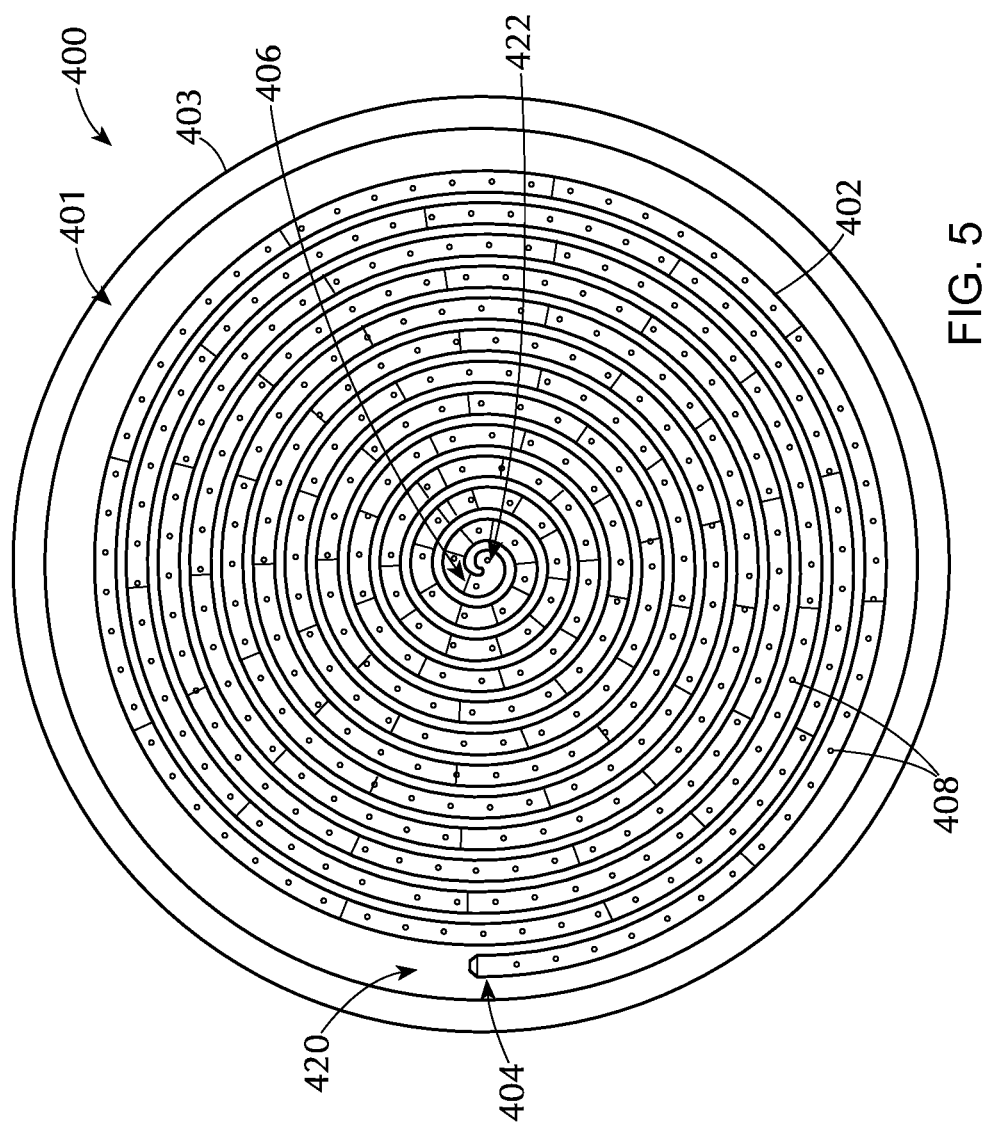
FIG. 5 shows a top view of a gas distribution apparatus in accordance with one or more embodiments of the invention.

In an embodiment, as shown in FIG. 5, the gas delivery plate 403 comprises a single delivery channel 402 in a back side of the gas delivery plate 403. The delivery channel 402 has ends 404, 406 located in an outer peripheral region and in a central region 422 of the gas distribution plate 403. The delivery channel 402 has an overall length, defined as the distance between the first end 404 and the second end 406 of about 240 inches. A plurality of apertures 408 are spaced along the overall length of the delivery channel 402. Along the overall length of the delivery channel 403 there are in the range of about 500 apertures and about 700 apertures. The delivery channel 403 has an average diameter of about 0.375 inches and adjacent portions of the spiral channel are spaced about 0.42 inches on center.

Some embodiments of the invention include more than one delivery channel 402. These multiple channels can be intertwined or separate depending on the needs of the processing system. Some channels can be recessed into a gas distribution plate as shown in FIG. 5, or can be individual tubes as shown in FIG. 3. In some embodiments, there are a combination of individual tubes and recessed channels.

Figure 16:
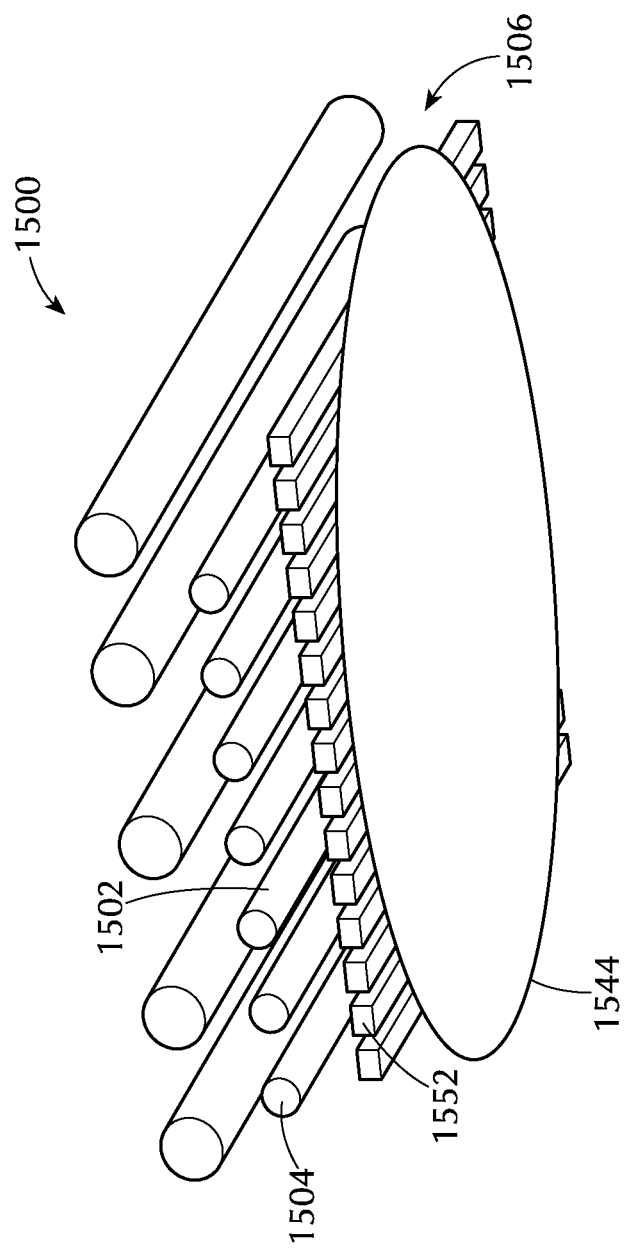
FIG. 16 shows a perspective view of a gas distribution apparatus in accordance with one or more embodiments of the invention.

Another embodiment of the invention is shown in FIGS. 10 through 15. A gas distribution apparatus 900 comprises two delivery channels 902a, 902b recessed in the back side 901 of a gas distribution plate 903. It will be understood that the delivery channels do not need to be recessed into the back of a gas distribution plate, but can be individual tubes, as shown in FIGS. 3 and 16. The first delivery channel 902a has a first end 904a and a second end 906a and a plurality of first apertures 908a spaced along the length of the first delivery channel 902a. The second delivery channel 902b has a third end 904b, a fourth end 906b and a plurality of second apertures 908b spaced along the length of the second delivery channel 902b.

A connector 910a is connected to the first end 904a of the first delivery channel 902a. The connector 910a is adapted to be connected to a gas source or a gas delivery system. A connector 912a is connected to the second end 906a of the first delivery channel 902a. The connector 912a is adapted to be connected to a gas delivery system. A connector 910b is connected to the third end 904b of the second delivery channel 902b. The connector 910b is adapted to be connected to a gas source or gas delivery system. A connector 912b is connected to the fourth end 906b of the second delivery channel 902b. The connector 912a is adapted to be connected to a gas delivery system.

In the embodiment shown in FIGS. 10 to 15, each of the delivery channels 902a, 902b form a spiral shape. One or more embodiments, as that shown in the Figures, have the two delivery channels 902a, 902b intertwined along the length of the spiral shape. It will be understood by those skilled in the art that the two delivery channels 902a, 902b can have shapes other than spiral and do not need to intertwine. In certain embodiments, the plurality of first apertures 908a and second apertures 908b extend through the gas distribution plate 903 to the front side 905 of the gas distribution plate 903.

Figure 11A:
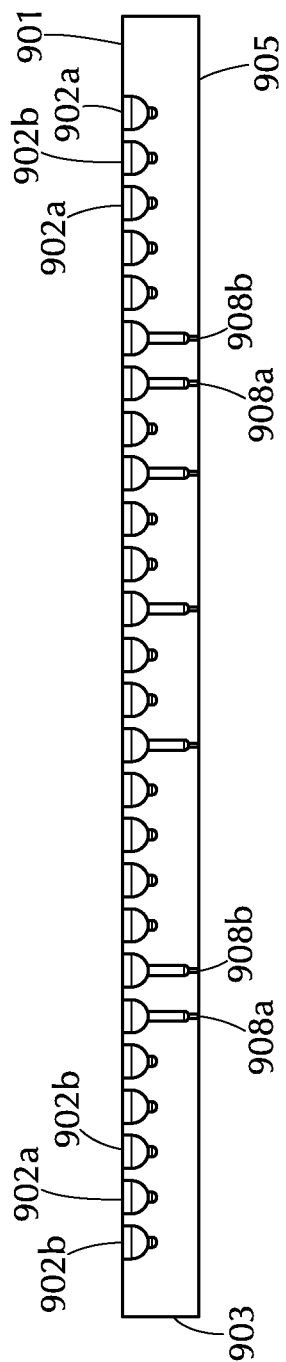
FIG. 11A shows a partial cross-sectional view of a gas distribution apparatus in accordance with one or more embodiments of the invention.

In some embodiments, each of the delivery channels 902a, 902b form a spiral shape with one or more of the first end 904a, second end 906a, third end 904b and fourth end 906b positioned in an outer peripheral region 920 of the gas distribution plate 903 and one or more positioned in a central region 922 of the gas distribution plate 903. FIG. 11A shows a cross-sectional view of a gas distribution plate with two gas delivery channels. The shape, number, spacing and angles of the apertures can vary, as previously described. FIG. 11B shows a portion of an embodiment of a gas distribution plate with a first delivery channel 902a and a second delivery channel 902b. Both of these channels 902a, 902b, at least at the cross-section shown, have two apertures extending from the channel to the front side 905 of the gas distribution plate. The apertures shown are positioned at the outer edges of the channels so that the gases in the channels are very close to each other when exiting the apertures. The apertures between the first channel and the second channel can also be offset so that only one channel would have apertures visible in any given cross-section to prevent gas phase reactions.

Figure 11C:
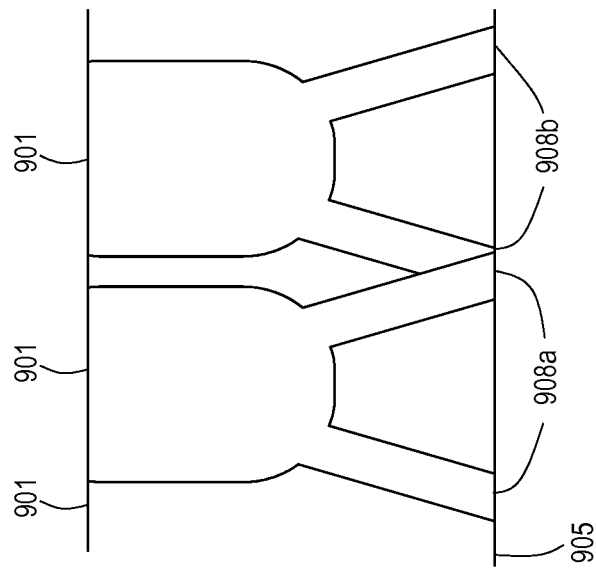
FIGS. 11B and 11C show partial cross-sectional views of gas delivery channels and apertures in accordance with one or more embodiments of the invention.
Figure 11B:
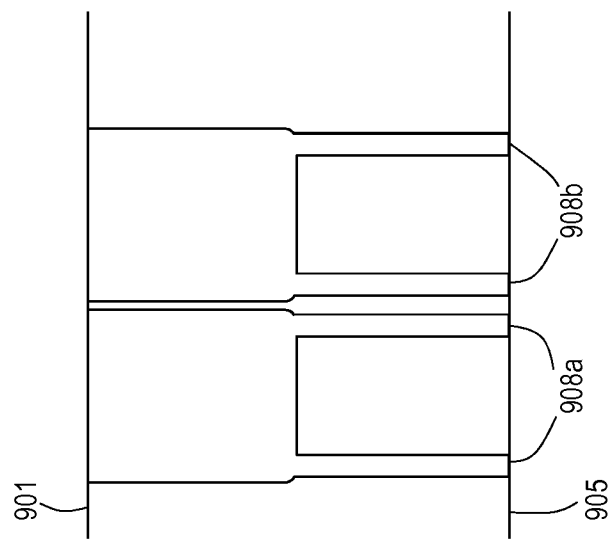

FIG. 11C shows another embodiment in which there are two gas channels with each channel having two apertures extending therefrom to form a delivery angle at the front side 905. Here, neither channel is shown with an aperture that expels gas directly below that aperture, but instead directs gases to the region beneath an adjacent channel. The first delivery channel 902a has an aperture that directs gas beneath the second delivery channel 902b and the second delivery channel 902b has an aperture that directs gas beneath the first delivery channel 902a. These apertures are shown to form holes at the same point on the front side, but it will be understood that these can be staggered along the length of the channel or that the cross-section shown for each channel can be from a different length from the inlets.

Figure 11D:
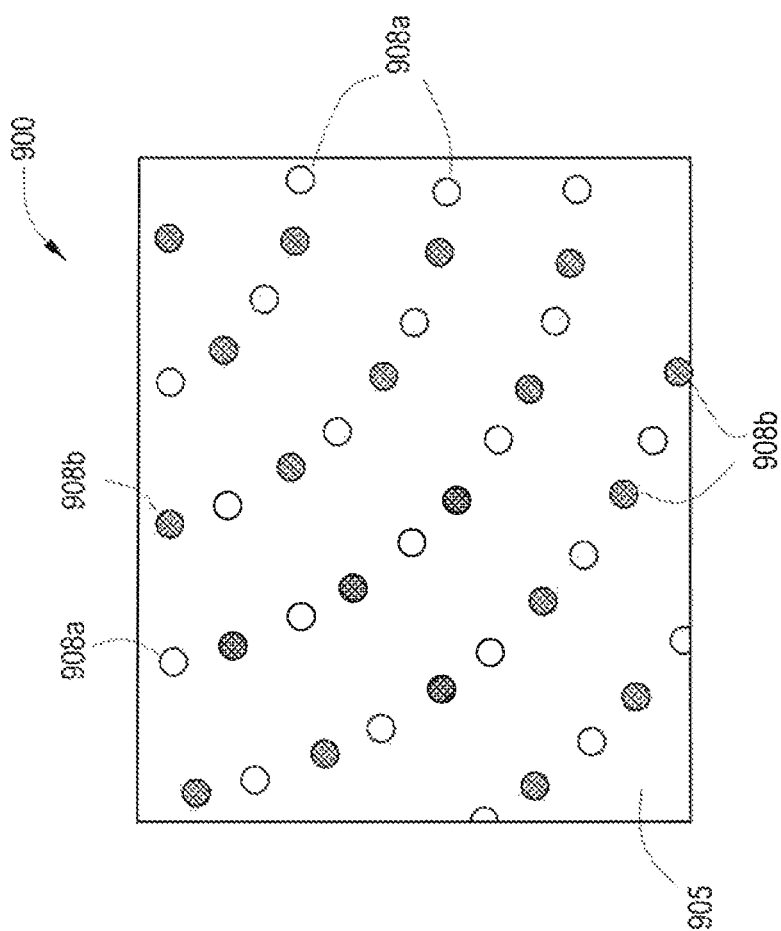
FIG. 11D shows the surface of a portion of the gas distribution plate of FIG. 10C.

The embodiment of FIG. 11C may be particularly effective at preventing deposition striping from the placement and orientation of the gases. FIG. 11D shows the surface of a portion of a gas distribution plate in which the channels have apertures like that of FIG. 11C which have offset cross-sections. The pattern of holes on the front side 905 presents an approximately alternating pattern of holes.

Figure 10:
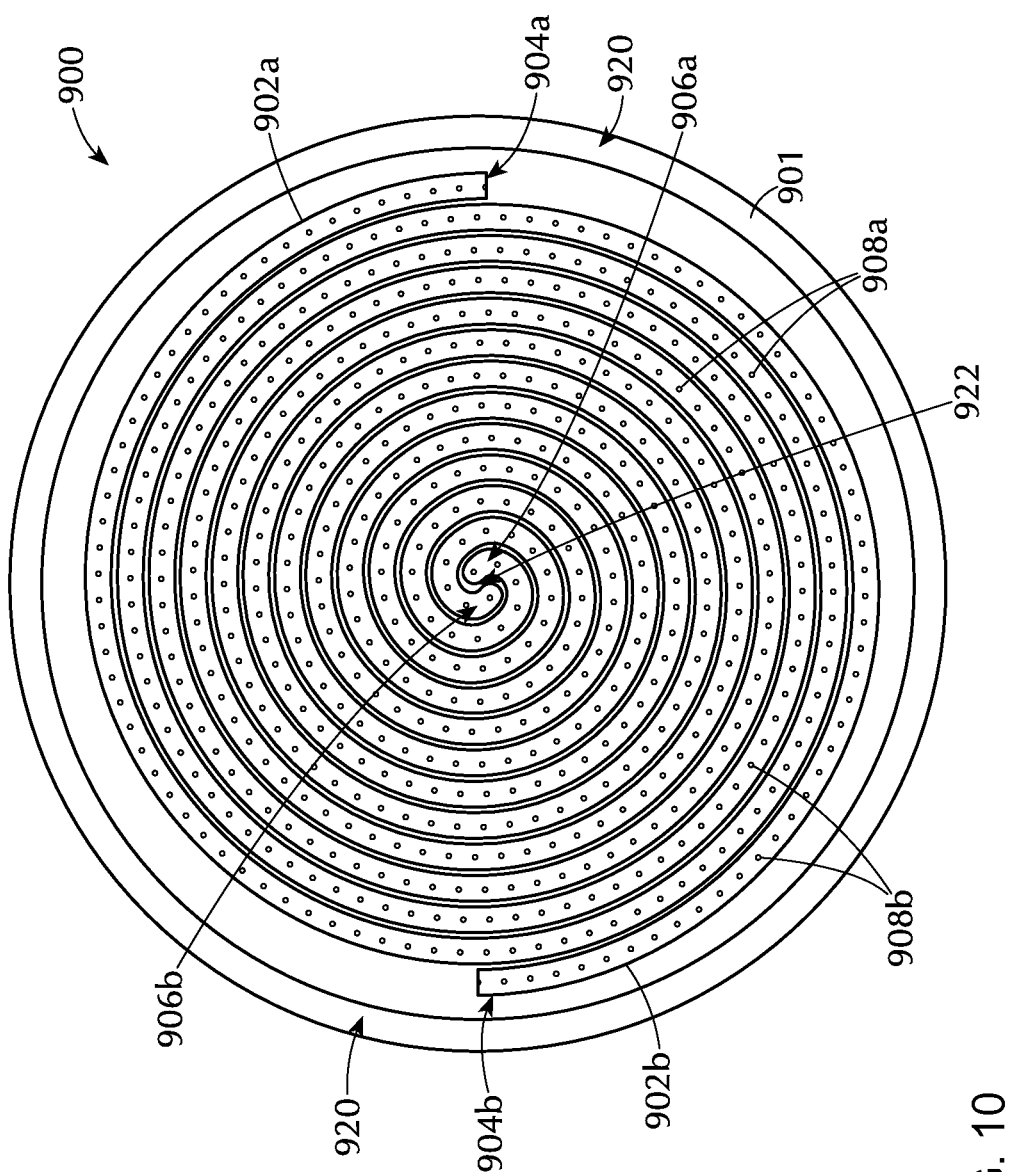
FIG. 10 shows a top view of a gas distribution apparatus in accordance with one or more embodiments of the invention.
Figure 12:
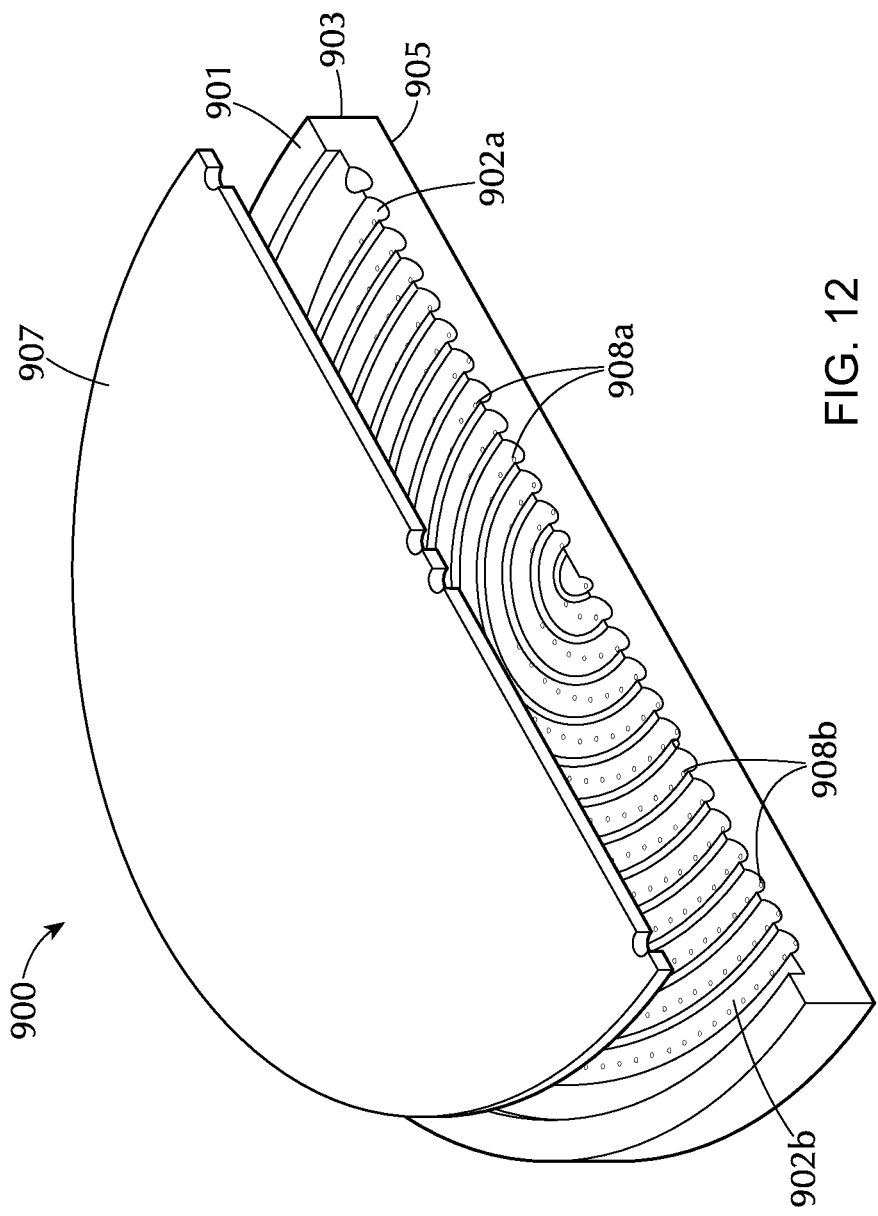
FIG. 12 shows a view of an exploded partial cross-sectional view of a gas distribution apparatus in accordance with one or more embodiments of the invention

FIG. 12 shows a back cover 907 for the gas distribution plate 903 shown in FIG. 10. There are four holes (not numbered) located in the back cover 907 which align approximately with ends the delivery channels 902a, 902b. The holes can be used to provide an access point for connectors. In some embodiments, any or all of connectors 910a, 910b, 912a and 912b are integrally formed with the back cover 907. Additionally, as seen in FIGS. 13 and 14, there can be one or more valves 914a, 914b, 916a, 916b in flow communication with the respective gas lines.

Figure 13:
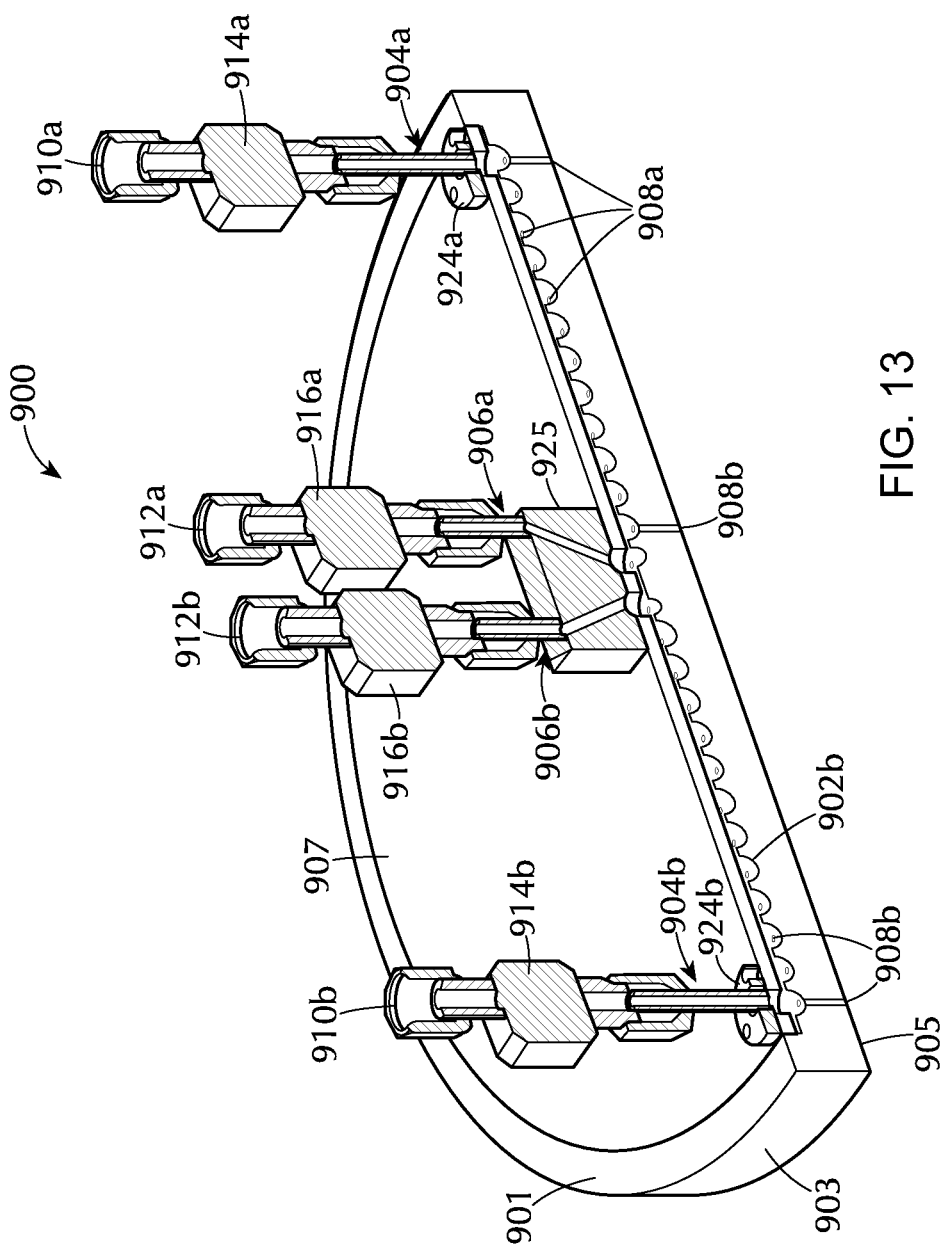
FIG. 13 shows a cross-section of a perspective view of a gas distribution apparatus in accordance with one or more embodiments of the invention
Figure 14:
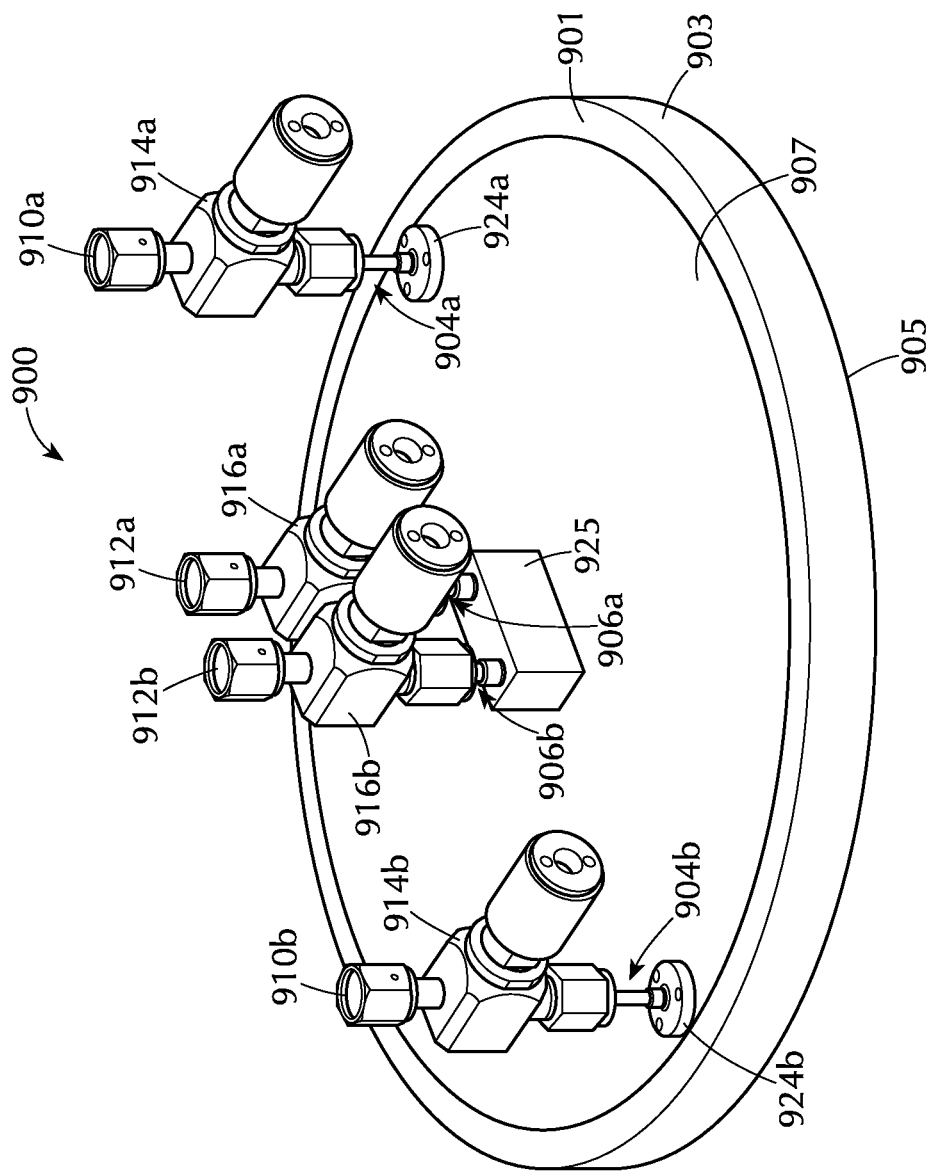
FIG. 14 shows a perspective view of a gas distribution apparatus in accordance with one or more embodiments of the invention.
Figure 15:
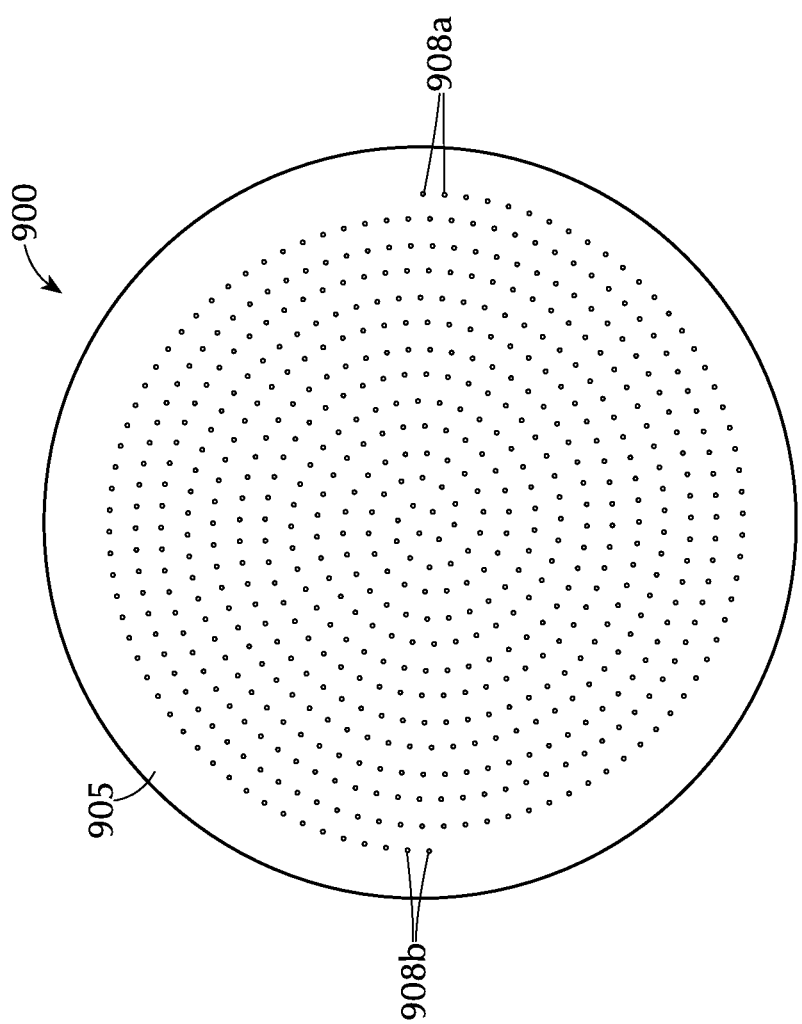
FIG. 15 shows a bottom view of a gas distribution apparatus in accordance with one or more embodiments of the invention.

FIGS. 13 and 14 show perspective views of a gas distribution apparatus 900 in accordance with various embodiments of the invention. The connectors 910a, 910b are shown connected to the back cover 907 with a flange 924a, 924b. The connection and gas-tight sealing of the flange 924a, 924b can be accomplished by any suitable mechanism and techniques as known to those skilled in the art. The connectors 912a, 912b can also be connected to the back cover 907 with a flange or with a block connection 925. The block 925 can be integrally formed with the back cover 907 or can be a separate piece. The block 925 may provide additional support and space for the outlet valves 916a, 916b, allowing the connecting tubes to protrude from the back cover 907 at an angle.

As the delivery channels spiral from the outer peripheral edge of the gas distribution plate to the central region, or vice versa, a seeming plurality of adjacent channels are observable in cross-section. With the spirals intertwined, the gas in every adjacent channel is from the other inlet 910a, 910b. The channels are separated by a distance from the adjacent channels. In some embodiments, the distance between the channels, measured from the center of the channel, are in the range of about 0.375 inches to about 0.475 inches, or in the range of about 0.40 inches to about 0.45 inches, or in the range of about 0.41 inches to about 0.43 inches. In one or more embodiments, the average distance between centers of the adjacent channels is about 0.42 inches.

The length of the gas channel shown in FIGS. 10-15 can vary depending on a number of factors, including, but not limited to, the diameter of the channel and the distance between the adjacent channels. In various embodiments, each of the delivery channels has a length in the range of about 70 inches to about 170 inches, or in the range of about 90 inches to about 150 inches, or in the range of about 100 inches to about 140 inches, or in the range of about 110 inches to about 130 inches. In one or more embodiments, the delivery channel has a length of about 120 inches.

The number of apertures are also dependent on a number of factors, including but not limited to, the length of the delivery channel and the spacing of the apertures. In some embodiments having a single spiral channel, there are in the range of about 150 to about 450 apertures, or in the range of about 200 to about 400 apertures, or in the range of about 250 to about 350 apertures. In various embodiments, there are greater than about 150, 200, 250, 300, 350 or 400 apertures along the length of the channel. In one or more embodiments, there are about 300 apertures along the length of each of the delivery channels.

In some embodiments of the apparatus exemplified by FIGS. 5 through 15, there is an insulating material (not shown) positioned between the back cover and the main body portion of the gas distribution apparatus (i.e., the portion including the gas delivery channel). This insulating material provides electrical isolation between the back cover and the main body portion of the gas distribution apparatus so that the back cover can be polarized relative to the main body portion. Doing so may allow for the ignition of a plasma within the gas distribution apparatus, or within the delivery channels. The plasma can then be flowed through the plurality of apertures into the processing region of the processing chamber, the processing region being the region between the gas distribution apparatus and the pedestal. This configuration may be referred to as a remote plasma because the plasma is formed (e.g., ignited) outside of the processing region.

Figure 17:
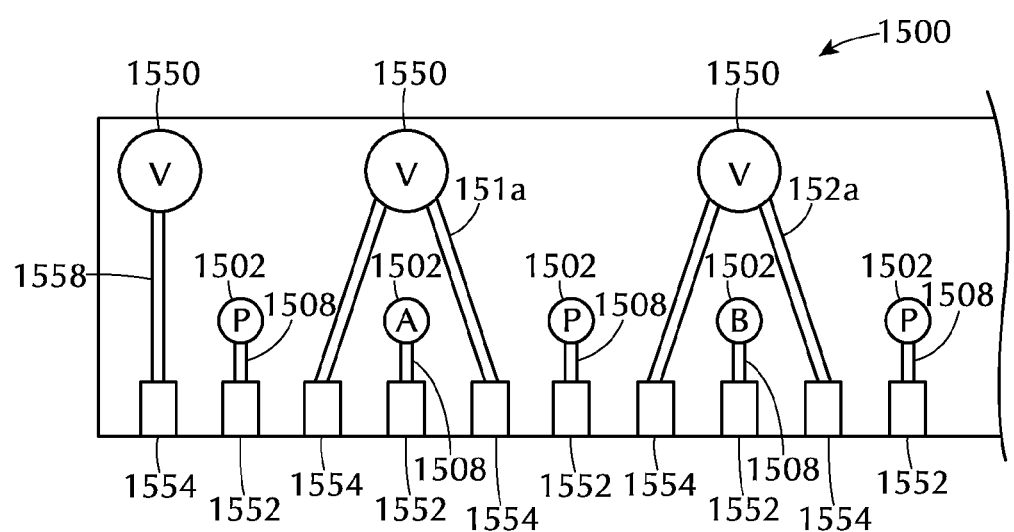
FIG. 17 shows a partial cross-sectional view of a gas distribution apparatus in accordance with one or more embodiments of the invention.

FIGS. 16 and 17 show another exemplary embodiment of a gas distribution apparatus 1500. The gas distribution apparatuses shown are particularly useful for spatially separated atomic layer deposition processes in which different portions of the substrate are simultaneously exposed to different deposition gases and the substrate 1544 is moved relative to the gas distribution apparatus so that all parts of the substrate are exposed sequentially to each of the deposition gases. In these embodiments, the gas distribution apparatus 1500 comprises a plurality of delivery channels 1502, each delivery channel 1502 extending substantially straight and substantially parallel to adjacent delivery channels. Each of the delivery channels 1502 has a first end 1504 and a second end 1506 with a plurality of spaced apertures 1508 there between. A gas distribution system can be in flow communication with any or both of the first end and the second end.

The gas distribution apparatus shown in FIGS. 16 and 17 have a plurality of elongate delivery channels 1502 and a plurality of elongate vacuum channels 1550. Each of the delivery channels 1502 and vacuum channels 1550 are connected to a output channel 1552 at the front side of the gas distribution apparatus. Each of the delivery channels 1502 is adapted to flow one or more of a reactive gas and a purge gas. Each delivery channel 1502 is connected to an output channel 1552 by a plurality of spaced apertures 1508. Each of the vacuum channels 1550 is connected to an inlet channel 1554 by a plurality of spaced vacuum apertures 1558. The plurality of apertures 1508 of each delivery channel 1502 are separated from the plurality of apertures 1508 of each adjacent delivery channel 1502 by at least one plurality of vacuum apertures 1558 from a vacuum channel 1550.

In the embodiment shown in FIG. 17, each of the central vacuum channels 1550 (not the end vacuum channels) are connected to two inlet channels 1554 by vacuum apertures 1508. The end vacuum channels 1550 are only connected to a single inlet channel 1554. It should be understood that this is merely exemplary and should not be taken as limiting the scope of the invention. Each inlet channel 1554 can have a dedicated vacuum channel 1550, or a single vacuum channel 1550 can be connected to more than two inlet channels 1554 through a plurality of vacuum apertures 1508.

While each of the delivery channels appear the same, there can be a different gas flowing through each. For example, purge channels (denoted P) may have a purge gas flowing there through, each of the first reactive gas channels (denoted A) may have a first reactive gas flowing there through and each of the second reactive gas channels (denoted B) may have a second reactive gas flowing there through. The vacuum channels (denoted V) are connected to a vacuum source. With reference to FIG. 17, a substrate 1544 (or more specifically, a fixed point on a substrate) moving from left to right would encounter in order a vacuum gas channel, a purge gas channel, a vacuum gas channel, a first reactive gas channel, a vacuum gas channel, a purge gas channel, a vacuum gas channel, a second reactive gas channel, a vacuum gas channel, etc., depending on the size of the gas distribution plate.

The delivery channel of FIGS. 16 and 17 can be used for plasma processing as well. The gas distribution apparatus 1500 can be biased relative to another portion of the chamber. For example, the gas distribution apparatus 1500 can be polarized relative to the pedestal, or the pedestal can be polarized relative to the gas distribution apparatus. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

Figure 18:
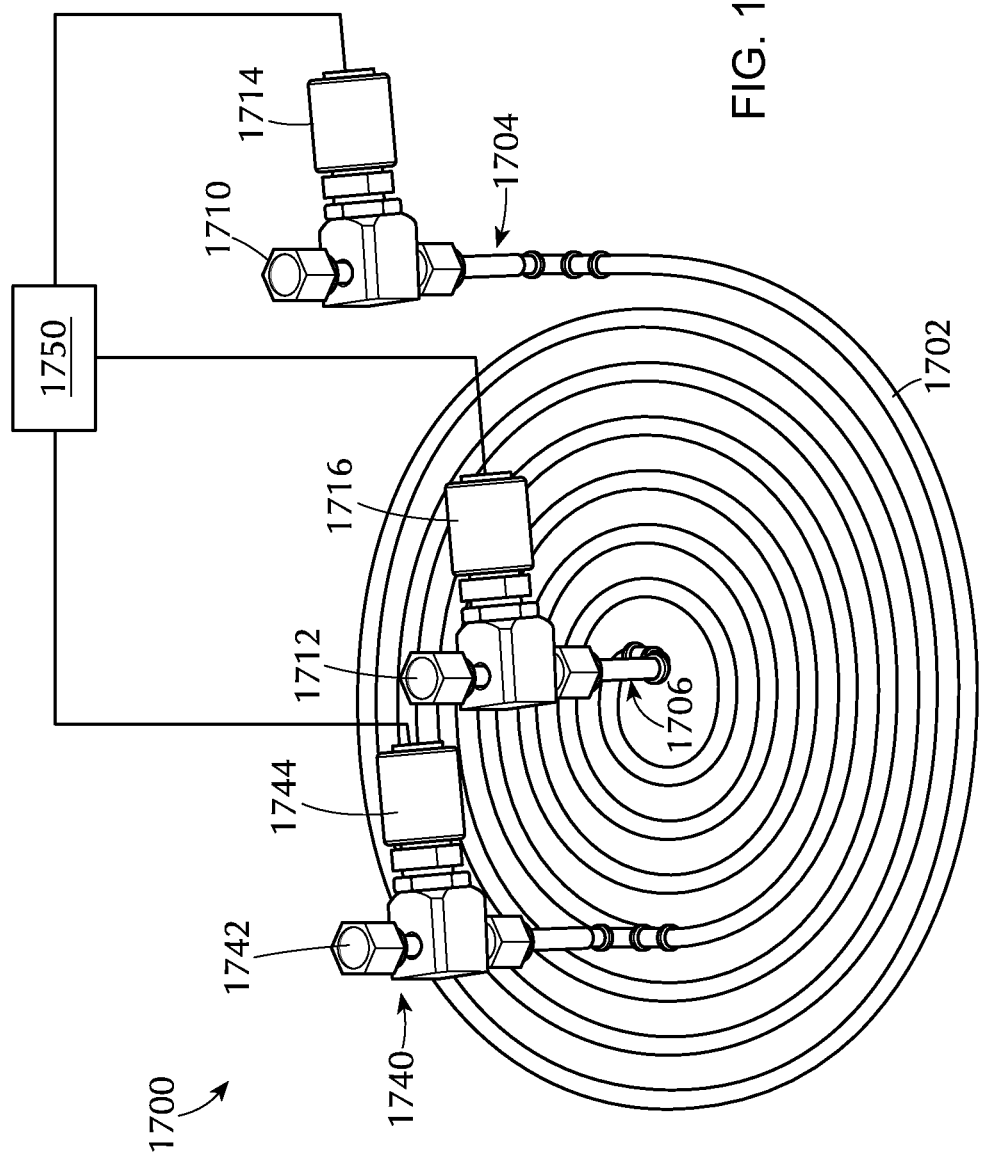
FIG. 18 shows a gas distribution apparatus in accordance with one or more embodiments of the invention.

In one or more embodiments, the gas distribution apparatus includes more than one outlet connected to a vacuum source. FIG. 18 shows a spiral shaped gas distribution apparatus 1700 which is similar to the apparatus 100 shown in FIG. 3. The apparatus includes a delivery channel 1702 with a first end 1704 and a second end 1706. An connector 1710 is connected to and in communication with the first end 1704 of the delivery channel 1702. A connector 1712 is connected to and in communication with the second end 1706 of the delivery channel 1702. The connector 1710 is connectable to a gas source (or vacuum source) and may include a valve 1714 that can control the flow of gas into (or out of) the delivery channel 1702 or completely cut off the flow of gas. An intermediate connector 1742, which is connectable to the gas delivery system, is position along the length of the delivery channel 1702. The intermediate connector 1742 shown is connected to the delivery channel 1702 at about the middle of the length of the channel 1702 and coupled to the delivery channel 1702 through an intermediate port 1740. The intermediate connector 1742 may include an intermediate valve 1744 that can control the flow of gas out of (or into) the delivery channel 1702 or completely cut off the gas flow. The valve 1714, 1716, 1744 are connected to a controller 1750. The controller is capable of independently opening or closing any or all of the valves to adjust the pressure of gases flowing through the delivery channel 1702 or purge the delivery channel 1702 of an existing gas.

The embodiment shown in FIG. 18 effectively includes two ends and one intermediate connector. Those skilled in the art will understand that there can be any number of connectors and/or ports spaced along the length of the delivery channel and at any position along the length of the channel. For example, the intermediate connector 1740 could be positioned at ⅓ of the length of the channel. Additionally, there can be any number of connectors. For example, the delivery channel may have four connectors, one at the end and one positioned at each of ¼, ½ and ¾ of the length of the delivery channel. In another example, the delivery channel includes four connectors, one at the end and one position at each of ¼, ¾ and 9/10 of the length of the delivery channel. In some embodiments, the delivery channel includes 2, 3, 4, 5, 6, 7, 8, 9, 10 or 11 total connectors (including a first end and a second end connector).

Figure 19B:
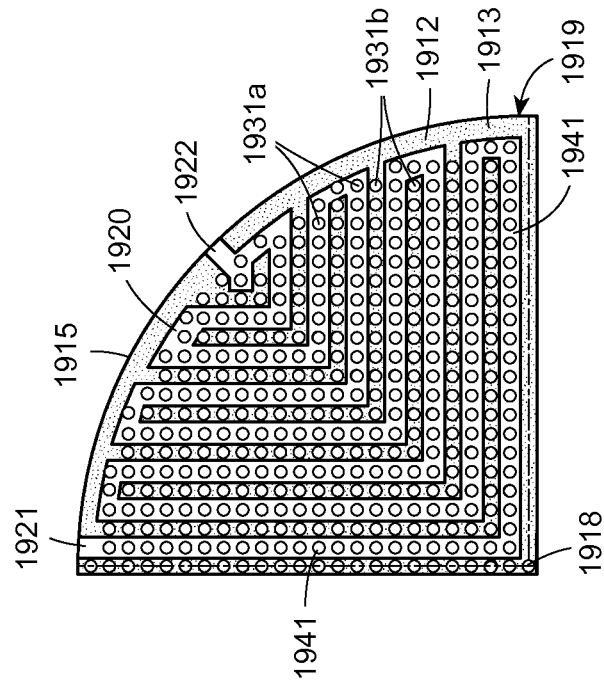
FIG. 19B shows an expanded view of a portion of the showerhead assembly of FIG. 19A.
Figure 19A:
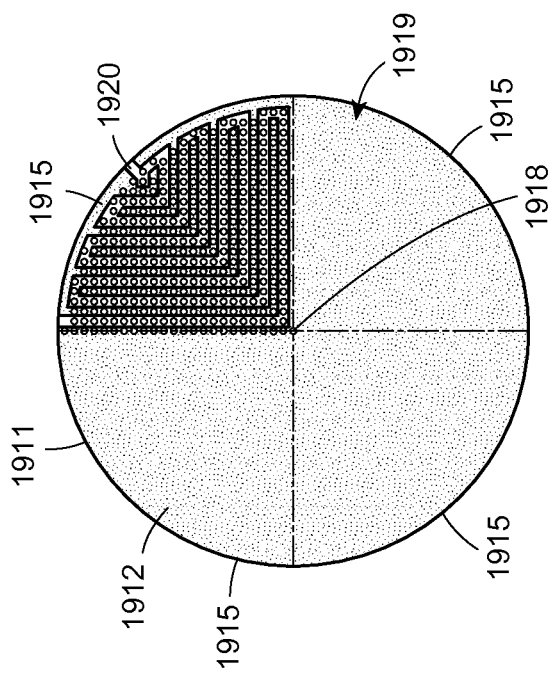
FIG. 19A a partial showerhead assembly in accordance with one or more embodiment of the invention.

FIG. 19A shows the front surface 1912 of a showerhead 1911 in accordance with one or more embodiment of the invention. The showerhead 1911 is divided into a plurality of sections 1915. FIG. 19A shows a showerhead 1911 divided into four sections, each taking about one-fourth of the showerhead 1911. This is merely exemplary, and as shown in other embodiments, the showerhead 1911 can be divided into any number of sections having about equal area. Each of the four sections shown in FIG. 19B has about equal areas. As used in this specification and the appended claims, the term "equal area", and the like, mean that each of the areas of the first surface attributed to the sections are within about 5% of each other.

Each of the plurality of sections 1915 comprises a gas delivery channel 1920. While FIG. 19A only shows one gas delivery channel 1920 in the upper right section, it will be understood that this is merely for illustrative purposes and that gas delivery channels 1920 will be located in each of the sections 1915. FIG. 19B shows an expanded view of the gas delivery channel 1920 shown in FIG. 19A. The gas delivery channels 1920 extend through the body 1913 of the showerhead 1911. The gas delivery channel 1920 includes a first end 1921 and a second end 1922. The first end 1921 and second end 1922 are in fluid communication with a gas delivery system like that shown in FIGS. 1 and 2.

Many factors can affect the flow of gas through the gas delivery channel 1920. For example, the shape of the channel including the number and angle of turns. Without being bound by any particular theory of operation, it is believed that the more bends there are in the channel, the greater the pressure drop across the channel (lengthwise). This is believed to be true for the angle of the turns as well.

In one or more embodiments, the gas delivery channel 1920 in each section comprises a series of connected L-shaped portions. This can be seen in the embodiment of FIG. 19B. Each of the L-shaped portions shown in FIG. 19B have about equal length legs 1941 for each equivalent row. For example, the channel row closes to the center of the showerhead has about equal length legs. Although it will be understood by those skilled in the art that there will be variability in the length of the legs and that this should not be taken as limiting the scope of the invention. For example, the left-most leg 1941 shown is slightly longer than the bottom-most leg because the left-most leg connects to the inlet 1921. The size of the L-shaped portions decreases as each portion moves further from the center 1918 of the showerhead 1911 toward an outer portion 1919 of the showerhead.

Figure 20:
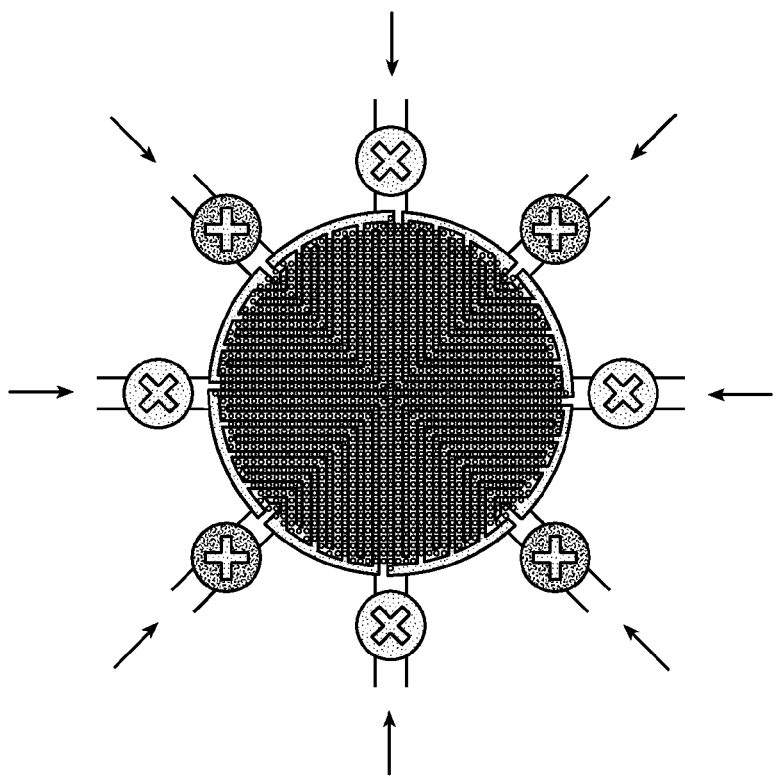
FIG. 20 shows a showerhead assembly in accordance with the embodiment of FIG. 19A with multiple inlets and outlets.

In some embodiments, as shown in FIG. 20, the flow channels in each section are rotationally symmetrical to the other flow channels. As used in this specification and the appended claims, the term "rotationally symmetrical" means that when looking at the first surface, turning the showerhead by 1/nth will result in a rotationally symmetrical showerhead, where n is the number of sections 1915. For example, rotating the section shown in the upper right quadrant about the center 1918 would result in a four-fold symmetrical pattern. The arrows shown in FIGS. 20 and 21 indicate that the gas delivery system is providing a flow of gas through each end of each gas delivery channel.

Figure 21:
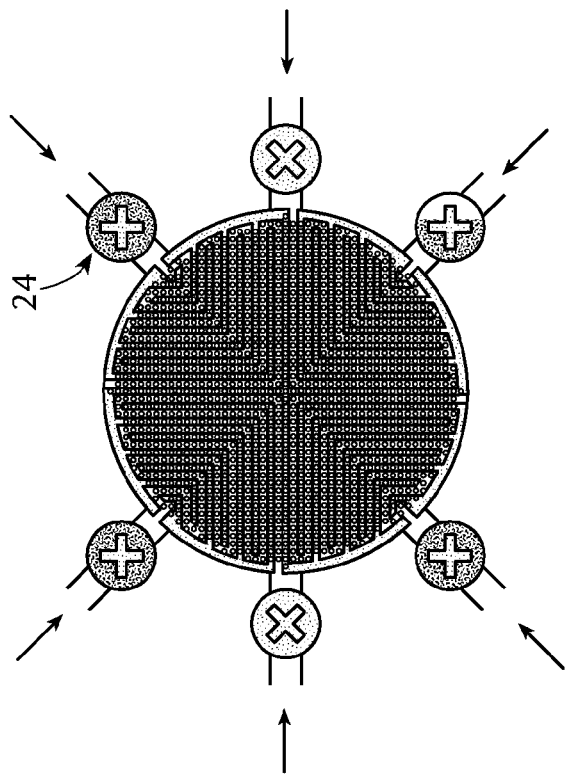
FIG. 21 shows another showerhead assembly in accordance with the embodiment of FIG. 19A with multiple inlets and outlets.

The aperture patterns shown in FIGS. 20 and 21 a sufficient for two separate gases. For example, a precursor gas and a reactant gas can be flowed through the showerhead simultaneously so that they are isolated from each other until entering the processing chamber. In this case, each of the channel ends associated with the gas delivery channel for the precursor can be referred to as the first end or second end. Assuming that the valves shown in FIGS. 20 and 21 are connected to the same gas channel, each of the light valves can be connected to the first end and each of the dark valves can be connected to the second end (or vice versa). This means that there are four first ends and four second ends shown in FIG. 20 and two first ends and four second ends in FIG. 21. It will be appreciated that each of these are equivalent gas delivery channels and that the gas channels associated with the reactant gas will have third ends and fourth ends, which are named as such merely to indicate that they are different flow channels.

In some embodiments, as shown in FIG. 21, the gas delivery channel 1920 in each section 1915 are mirror images of the adjacent sections 1915. As used in this specification and the appended claims, the term "mirror images" means that if a first section were flipped about one radial axis to form a second section, the flow channel design of the first section would form a mirror image of the second section. This does not meant that the direction of the passages and the first surface change, it merely refers to the design, or shape, of the flow channel and the location of the inlet and outlet. For example, FIG. 21 shows an embodiment where the sections are mirror images. It can also be seen from FIG. 21, that two adjacent sections 1915 can share a common end 1923 with separate ends 1924 on the other side of the gas delivery channel.

The gas distribution apparatus described can be used to form one or more layers during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). Remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required.

According to one or more embodiments, the gas distribution apparatus can be used to subject a substrate to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, preclean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

A substrate can be processed in single substrate deposition chambers using, for example, the gas distribution apparatus described. In such chambers, a single substrate is loaded, processed and unloaded before another substrate is processed. A substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

The invention claimed is:

1. A gas distribution apparatus to control a flow of gas into a process chamber, comprising:
   a gas distribution plate having a front side and a back side;
   a gas delivery channel extending through the gas distribution plate, the delivery channel having a length defined by a first end and a second end, the delivery channel including a plurality of apertures spaced along the length extending through the gas distribution plate to the front side of the gas distribution plate;
   a gas delivery system connected to the first end and the second end of the delivery channel, the gas delivery system comprising a first inlet line in flow communication with the first end of the delivery channel and the second inlet line in flow communication with the second end of the delivery channel, a pump line, a first purge line in flow communication with the first inlet line and a second purge line in flow communication with the second inlet line; and
   a controller to regulate the flow of the gas through the delivery channel and into the process chamber.

2. The gas distribution apparatus of claim 1, further comprising an inlet line in flow communication with the first inlet line and the second inlet line and an inlet wye which separates gas flowing through the inlet line into the first inlet line and second inlet line.

3. The gas distribution apparatus of claim 2, further comprising an inlet valve in flow communication with the inlet line upstream of the inlet wye.

4. The gas distribution apparatus of claim 2, further comprising a first inlet valve in flow communication with the first inlet line and a second inlet valve in flow communication with the second inlet line.

5. The gas distribution apparatus of claim 1, further comprising a purge line in flow communication with the first purge line and the second purge line and a purge wye to separate gas flowing through the purge line into the first inlet line and second inlet line.

6. The gas distribution apparatus of claim 5, wherein further comprising a purge valve in flow communication with the purge line upstream of the purge wye.

7. The gas distribution apparatus of claim 5, further comprising a first purge valve in flow communication with the first purge line and a second purge valve in flow communication with the second purge line.

8. The gas distribution apparatus of claim 1, wherein the pump line is in flow communication with the first inlet line and the second inlet line.

9. The gas distribution apparatus of claim 8, further comprising a pump valve in flow communication with the pump line.

10. The gas distribution apparatus of claim 1, wherein the purge line maintains a constant flow of a purge gas.

11. The gas distribution apparatus of claim 1, further comprising a bypass line in flow communication with the inlet line and the pump line.

12. A gas distribution apparatus to control a flow of gas into a process chamber, comprising:
   a gas distribution plate having a front side and a back side;
   a first gas delivery channel extending through the gas distribution plate, the first delivery channel having a length defined by a first end and a second end, the first delivery channel including a plurality of apertures spaced along the length extending through the gas distribution plate to the front side of the gas distribution plate;
   a second gas delivery channel extending through the gas distribution plate, the second delivery channel having a length defined by a third end and a fourth end, the second delivery channel including a plurality of apertures spaced along the length extending through the gas distribution plate to the front side of the gas distribution plate;
   a gas delivery system comprising a first inlet line, a second inlet line, a third inlet line, a fourth inlet line, a pump line, a first purge line, a second purge line, a third purge line and a fourth purge line, the first inlet line in flow communication with the first end of the first gas delivery channel, the second inlet line in flow communication with the second end of the first gas delivery channel, the third inlet line in flow communication with the third end of the second gas delivery channel and the fourth inlet line in flow communication with the fourth end of the second gas delivery channel, the first purge line in flow communication with the first inlet line, the second purge line in flow communication with the second inlet line, the third purge line in flow communication with the third inlet line and the fourth purge line in flow communication with the fourth inlet line; and
   a controller to regulate the flow of the gas through the first gas delivery channel and the second gas delivery channel and into the process chamber.

13. The gas distribution apparatus of claim 12, wherein the first gas delivery channel and the second gas delivery channel are intertwined spirals.

14. The gas distribution apparatus of claim 12, wherein the first gas delivery channel is positioned above the second gas delivery channel.

15. The gas distribution apparatus of claim 1, wherein the purge line maintains a constant flow of a purge gas.

16. The gas distribution apparatus of claim 1, further comprising a bypass line in flow communication with one or more of the first inlet line and the second inlet line and the pump line, and a second bypass line in flow communication with one or more of the third inlet line and the fourth inlet line and with the pump line.

17. A processing chamber comprising at least one gas distribution apparatus according to claim 12.

18. The processing chamber of claim 17, wherein the gas distribution apparatus comprises at least two first gas delivery channels and at least two second gas delivery channels, each of the first gas delivery channels and second gas delivery channels arranged to form a circular gas distribution assembly.

* * * * *